(12) United States Patent
Ishikawa et al.

(10) Patent No.: US 8,400,830 B2
(45) Date of Patent: Mar. 19, 2013

(54) NONVOLATILE SEMICONDUCTOR MEMORY DEVICE AND DRIVING METHOD THEREFOR

(75) Inventors: Yutaka Ishikawa, Osaka (JP); Kazuya Ishihara, Osaka (JP); Yoshiji Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 13/131,388

(22) PCT Filed: Nov. 18, 2009

(86) PCT No.: PCT/JP2009/069545
§ 371 (c)(1),
(2), (4) Date: May 26, 2011

(87) PCT Pub. No.: WO2010/061760
PCT Pub. Date: Jun. 3, 2010

(65) Prior Publication Data
US 2011/0238902 A1   Sep. 29, 2011

(30) Foreign Application Priority Data

Nov. 26, 2008   (JP) .................................. 2008-301635

(51) Int. Cl.
*G11C 11/34* (2006.01)
(52) U.S. Cl. ......... 365/185.11; 365/185.03; 365/185.05; 365/185.21; 365/185.22; 365/185.23; 365/189.14; 365/189.011; 365/189.04; 365/230.03
(58) Field of Classification Search ............. 365/185.11, 365/185.03, 185.05, 185.21, 185.22, 185.23, 365/189.14, 189.011, 189.04, 230.03
See application file for complete search history.

(56) References Cited

U.S. PATENT DOCUMENTS

| | | | |
|---|---|---|---|
| 6,815,744 B1 | 11/2004 | Beck et al. | |
| 7,813,178 B2 | 10/2010 | Nakai | |
| 7,870,357 B2 * | 1/2011 | Davis et al. | ................... 711/167 |
| 7,885,102 B2 | 2/2011 | Hanzawa et al. | |
| 2008/0151656 A1 * | 6/2008 | Nakai | ....................... 365/189.16 |
| 2010/0118592 A1 | 5/2010 | Ishihara et al. | |

FOREIGN PATENT DOCUMENTS

| | | |
|---|---|---|
| JP | 09-097218 | 4/1997 |
| JP | 2001-67258 | 3/2001 |
| JP | 2002-537627 | 11/2002 |
| JP | 2008-159178 | 7/2008 |
| JP | 2010-113742 | 5/2010 |
| WO | WO 2008/032394 | 3/2008 |

OTHER PUBLICATIONS

International Search Report for PCT/JP2009/069545, dated Mar. 2, 2010.

* cited by examiner

*Primary Examiner* — Fernando Hidalgo
(74) *Attorney, Agent, or Firm* — Nixon & Vanderhye, P.C.

(57) ABSTRACT

A nonvolatile semiconductor memory device in which a memory cell life can be prolonged while making it possible to perform writing in units of bits. When command information represents writing, a comparing unit 37 compares written data in a target memory cell with write target data to give a comparison result to a write/read control unit 40, when the comparison result represents matching, the write/read control unit 40 does not instruct a decoder unit (51A, 51B, and 53) to perform writing in the target memory cell, and when the comparison result represents mismatching, the write/read control unit 40 instructs the decoder unit to write the write target data in the target memory cell.

13 Claims, 15 Drawing Sheets

NONVOLATILE SEMICONDUCTOR MEMORY DEVICE AND DRIVING METHOD THEREFOR

CROSS-REFERENCE TO RELATED APPLICATIONS

This application is a National Phase filing under 35 U.S.C. §371 of International Application No. PCT/JP2009/069545 filed on Nov. 18, 2009, and which claims priority to Japanese Patent Application No. 2008-301635 filed on Nov. 26, 2008.

TECHNICAL FIELD

The present invention relates to a nonvolatile semiconductor memory device and a driving method therefor and, in particular, to a nonvolatile semiconductor memory device the number of rewritable times of which is limited and a driving method therefor.

BACKGROUND ART

In recent years, as a nonvolatile memory to be called a post flash memory, a resistive nonvolatile memory RRAM (Resistive Random Access Memory) using a variable resistive element the electric resistance of which is reversibly changed by applying a voltage pulse is going to come into practical use.

FIG. 15 is a schematic structural diagram of the RRAM. An RRAM 100 shown in FIG. 15 has a very simple structure in which a lower electrode 103 serving as a second electrode, a variable resistor 102, and an upper electrode 101 serving as a first electrode are sequentially laminated. As the variable resistor 102, for example, a titanium oxide ($TiO_2$) film, a nickel oxide (NiO) film, a zinc oxide (ZnO) film, and a niobium oxide ($Nb_2O_5$) film, which are oxides of transition metals, can be used (see Patent Document 1 and Non-Patent Document 1 described below). The RRAM 100 can reversibly change a resistance of the variable resistor 102 by applying a voltage pulse between the upper electrode 101 and the lower electrode 103. A resistance in a reversible resistance change operation is read to make it possible to realize a resistive nonvolatile memory.

A write (erase) characteristic in the RRAM is largely different from that of a flash memory. For example, in a mode called a bipolar switching mode, two changes in resistance including an increase in resistance and a decrease in resistance can be realized at several 10 nanoseconds by applying a low voltage of 1.5 V to 3 V. In this manner, writing information "1" (erasing operation) and writing information "0" (writing operation) can be simultaneously performed, i.e., data can be overwritten to make it possible to realize a rewriting operation at a high speed in units of bits. This RRAM is expected to be able to realize a reading/writing speed almost equal to that of a DRAM (Dynamic Random Access Memory).

A conventional DRAM has a memory cell configured by a switching MISFET and a capacitor connected in series with the switching MISFET to store information by accumulating electric charges in the capacitor. For this reason, due to the characteristic that causes information to be stored by accumulating electric charges in the capacitor, the DRAM has an advantage that the number of rewritable times is rarely limited.

On the other hand, the RRAM has a configuration in which information is rewritten by changing a resistance of a variable resistor. It is considered that the behavior of oxygen in a metal oxide constituting the variable resistor is responsible for the change in resistance of the variable resistor. More specifically, when an oxygen defect occurs in the metal oxide, the resistance of the metal oxide decreases. In contrast to this, when the oxygen defect is buried with oxygen again, the resistance may increase. More specifically, oxygen ions ($O^{2-}$) move in an electric field applying direction by applying a high electric field to a high-resistance element, oxygen defects occur at positions where the oxygen ions are pulled out by the movement of the oxygen ion, and an electric resistance may decreases due to hopping conduction in which carriers are conducted between localized levels generated by the oxygen defects. With respect to an increase in resistance of a resistor the resistance of which is reduced, the resistor may be heated with Joule heat by causing a current to flow in a low-resistance portion, oxygen defects may be buried with oxygen when the current has a threshold value or more to increase the resistance of the resistor again.

Therefore, since writing of information in the RRAM is performed by a change in resistance with a physical change that is movement of oxygen ions in the metal oxide, in comparison with a DRAM in which information is written by accumulation or movement of electric charges, physical damage on an information storing unit (i.e., a variable resistor) is serious. More specifically, when a rewriting operation is repeated in the RRAM (resistance is repeatedly changed), a memory cell in which oxygen defects occur or oxygen cannot be recombined is consequently generated. In such a memory cell, a low-resistance state cannot be changed even though a voltage for rewriting is applied. This means that rewriting of information cannot be accurately executed.

More specifically, in the RRAM, in comparison with a DRAM, the number of rewritable times is disadvantageously limited. To that end, the RRAM requires a method of suppressing the number of rewritable times for the same memory cell and prolonging the life of each memory cell.

As a conventional method of prolonging the life of a nonvolatile memory cell, a wear leveling method that averages the numbers of using times of memory cells in a memory chip has been used. This method manages the numbers of rewritable times or orders of rewriting in units of blocks to prolong the life.

For example, the following Patent Document 2 describes a method of arranging erasing times counters in blocks, preferentially using blocks in which the values of the erasing times counters are small in all the blocks, and averaging the numbers of erasing times of all the blocks to prolong the life of the nonvolatile memory. The following Patent Document 3 describes a method that replaces a physical address value of a table that converts a logic address into a physical address with an idle physical address value read from an FILO (First in Last Out) in which idle physical address values are written to prevent a physical address at which data is rewritten from being biased so as to prolong the life of a nonvolatile memory.

PRIOR ART DOCUMENTS

Patent Documents

Patent Document 1: Japanese Published Patent Publication No. 2002-537627

Patent Document 2: Japanese Unexamined Patent Publication No. 9-97218

Patent Document 3: Japanese Unexamined Patent Publication No. 2001-67258

Non-Patent Document

Non-Patent Document 1: H. Pagnia et al., "Bistable Switching in Electroformed Metal-Insulator-Metal Devices", Phys. Stat. Sol. (a), vol. 108, pp. 11-65, 1988

SUMMARY OF THE INVENTION

Problems to be Solved by the Invention

As described above, as a conventional method for prolonging the life of a memory the number of rewritable times of which is limited, a wear leveling method has been used. However, in use of the wear leveling method, the number of rewritable times needs to be managed.

In a device like a flash memory that inherently performs rewriting in units of blocks (capacitances that are large to some extend), the numbers of rewritable times can also be easily managed in units of blocks, and wear leveling also functions as a very effective life prolonging method. However, when the same method is employed in a nonvolatile memory like an RRAM that can freely perform rewriting in units of bits, the characteristic feature in which rewriting can be performed in units of bits cannot be effected.

In a flash memory, in execution of rewriting, after erasing is performed in units of blocks, writing is performed. More specifically, also in rewriting that causes deterioration, the numbers of rewritable times needs only be managed in units of blocks. However, when rewriting of a memory can be freely performed in units of bits as in an RRAM, in order to effect the characteristic feature, the numbers of rewritable times need to be managed in units of bits (or units such as words in which access is performed at once). As a result, a large amount of capacity is consumed to record the numbers of rewritable times. As in a flash memory, when rewriting is managed in units of blocks at once, the number of rewritable times of an actual memory cell is not matched with the number of rewritable times of all the blocks.

The present invention has been made in consideration of the above problems and an object thereof is to provide a nonvolatile semiconductor memory device that can prolong the life of a memory cell without managing the number of rewritable times.

Means for Solving the Problem

A nonvolatile semiconductor memory device according to the present invention to achieve the above object includes: a memory cell array having a first sub-bank in which a plurality of nonvolatile memory cells are arranged in the form of a matrix, first terminals of the memory cells of the same row are connected to a common word line, and second terminals of the memory cells of the same column are connected to a common bit line and a second sub-bank having the same configuration as that of the first sub-bank; a write/read control unit that performs write or read control for a target memory cell corresponding to a designated address; a decoder unit that applies a voltage to the bit line and the word line based on an instruction from the write/read control unit to apply a write voltage or a read voltage to the target memory cell; a read circuit that reads written data in the target memory cell to which the read voltage is applied; and a comparing unit that compares a plurality of data to be input, wherein, when respectively designated write target data are written in the plurality of target memory cells located in the first-sub-bank and the second sub-bank, the decoder unit executes, in the same time zone, a first operation in which a read voltage is applied to a first target memory cell in the first sub-bank and a second operation in which a write voltage is applied to a second target memory cell only when a comparison result between the written data of the second target memory cell in the second sub-bank and the write target data to the second target memory cell by the comparing unit represents mismatching.

According to the characteristics of the nonvolatile semiconductor memory device according to the present invention, in a write process, before an actual write process, the comparing unit executes a comparing process between written data which is written in a selected memory cell corresponding to a write destination address and write target data. Only when the comparison result represents mismatching, a write voltage for writing the write target data is applied to the same memory cell. When the comparison result represents matching, the write voltage is not applied.

Since the conventional wear leveling method is a method of averaging the numbers of using times of memory cells to prolong the life of the entire memory chip, overwriting in a memory cell is performed even though the same data is overwritten. As a result, the memory cell cannot be avoided from being deteriorated. However, according to the configuration of the present invention, in comparison with the conventional method, the number of times of a write process performed by actually applying a write voltage to the same memory cell is reduced. In this manner, the life of each of the memory cells can be prolonged.

In a write process, the life of the memory cell can be prolonged by only comparing written data of a selected memory cell corresponding to a write destination address with write target data. More specifically, unlike in the conventional technique, the numbers of write times or orders of writing need not be managed. For this reason, the present invention can also be easily applied to an RRAM in which data can be written (rewritten) in units of bits.

Furthermore, according to the above characteristics, while the written data and the write target data are compared with each other for one sub-bank, a write process can be performed by applying a write voltage to another sub-bank. For this reason, a time lag does not occur in the write process. More specifically, the life of a memory cell in each sub-bank can be prolonged without extending time required for the write process in comparison with the time required in the conventional method.

In the above characteristics, an even-number address can be allocated to one sub-bank (first sub-bank), and an odd-number address can be allocated to another sub-bank (second sub-bank). In this case, serial addresses are alternately allocated to sub-banks. Therefore, when burst writing is performed, within a time in which write target data is written in a memory cell corresponding to a write destination address in one sub-bank, written data in a memory cell corresponding to an address next to the write destination address being present in another sub-bank can be read.

In the nonvolatile semiconductor memory device according to the present invention, in addition to the characteristics described above, when the respectively designated write target data are written in the plurality of target memory cells located in the first sub-bank and the second sub-bank, the decoder unit is configured to execute an operation step including the first operation and the second operation two or more times while changing the first target memory cell and the second target memory cell, and the second target memory cell in each of the operation steps is the first target memory cell in the previously executed operation step.

With this configuration, the written data is already read from the second target memory cell serving as a target to be executed by the second operation because the second target memory cell functions as the first target memory cell in the previously operated operation step. Thus, in the second operation, without reading the written data from the second target memory cell again, the write target data can be written only when the write target data is different from the written data.

In the nonvolatile semiconductor memory device according to the present invention, in addition to the characteristics, the decoder unit includes a row decoder that is arranged in common in the first sub-bank and the second sub-bank and simultaneously applies a voltage on the word lines corresponding to the first sub-bank and the second sub-bank, a first column decoder that applies a voltage to the bit line of the first sub-bank, and a second column decoder that applies a voltage to the bit line of the second sub-bank, wherein the first operation is an operation in which the first column decoder applies a read voltage to a bit line connected to the first target memory cell in a state in which the row decoder applies a voltage to the word line connected to the first target memory cell, and the second operation is an operation in which the second column decoder applies a write voltage to a bit line connected to the second target memory cell located at the same row as that of the first target memory cell only when a comparison result between the written data in the second target memory cell and the write target data to the second target memory cell represents mismatching.

In addition to the characteristics described above, in the nonvolatile semiconductor memory device according to the present invention, the memory cell array includes a plurality of memory units each configured by the first sub-bank and the second sub-bank, and the decoder unit is provided for each of the memory units, when the respectively designated write target data are written to the plurality of target memory cells arranged across the plurality of memory units, the decoder unit provided in each of the memory units in which the target memory cells are present executes the first operation and the second operation in the same time zone.

With the above configuration, even in writing of write target data having a multi-bit configuration, the number of times of writing in the memory cells can be reduced without increasing a time required for writing and increasing an amount of required management, and the life of the memory cells can be prolonged.

In the nonvolatile semiconductor memory device according to the present invention, in addition to any one of the characteristics, the memory cell comprises a variable resistive element the resistance of which is reversibly changed depending on an application voltage and is configured to store information depending on a resistance of the variable resistive element.

In a method of driving a nonvolatile semiconductor memory device according to the present invention, the nonvolatile semiconductor memory device includes a memory cell array having a first sub-bank in which a plurality of nonvolatile memory cells are arranged in the form of a matrix, first terminals of the memory cells of the same row are connected to a common word line, and second terminals of the memory cells of the same column are connected to a common bit line, and a second sub-bank having the same configuration as that of the first sub-bank, when respectively designated write target data are written in the plurality of target memory cells located in the first-sub-bank and the second sub-bank, a first operation in which a read voltage is applied to a first target memory cell in the first sub-bank and a second operation in which a write voltage is applied to a second target memory cell only when a comparison result between the written data of the second target memory cell in the second sub-bank and the write target data to the second target memory cell represents mismatching are executed in the same time zone.

In the method of driving a nonvolatile semiconductor memory device according to the present invention, in addition to the characteristics described above, when the respectively designated write target data are written in the plurality of target memory cells located in the first sub-bank and the second sub-bank, an operation step including the first operation and the second operation is executed two or more times while changing the first target memory cell and the second target memory cell, and the second target memory cell in each of the operation steps is the first target memory cell in the previously executed operation step.

In the method of driving a nonvolatile semiconductor memory device according to the present invention, in addition to the characteristics described above, the memory cell array includes a plurality of memory units each configured by the first sub-bank and the second sub-bank, and, when the respectively designated write target data are written to the plurality of target memory cells arranged across the plurality of memory units, in each of the memory units in which the target memory cells are present, the first operation and the second operation are executed in the same time zone.

The nonvolatile semiconductor memory device according to the present invention includes: a memory cell array in which a plurality of memory cells each having a variable resistive element that stores information by a change in electric resistance are arranged in a row direction and a column direction, first terminals of the memory cells of the same row are connected to a common word line, and second terminals of the memory cells of the same column are connected to a common bit line; a write/read control unit that performs write or read control for a target memory cell corresponding to a designated address; a decoder unit that applies a voltage to the bit line and the word line based on an instruction from the write/read control unit to apply a write voltage or a read voltage to the target memory cell; a read circuit that reads written data in the target memory cell to which the read voltage is applied; and a comparing unit that compares a plurality of data to be input, wherein, when write target data is written in the target memory cell, the decoder unit applies the read voltage to the target memory cell based on an instruction from the write/read control unit, the comparing unit compares the write target data and the written data read by the read circuit and gives a comparison result to the write/read control unit, and the write/read control unit gives an instruction to the decoder unit to write the write target data in the target memory cell only when the comparison result represents mismatching.

According to the characteristics of the nonvolatile semiconductor memory device according to the present invention, in a write process, before an actual writing, the comparing unit executes a comparing process between written data which is written in a selected memory cell corresponding to a write destination address and write target data. Only when the comparison result represents mismatching, a write voltage to write the write target data is applied to the same memory cell. When the comparison result represents matching, the write voltage is not applied.

Since the conventional wear leveling method is a method of averaging the numbers of using times of memory cells to prolong the life of the entire memory chip, overwriting in a memory cell is performed even though the same data is overwritten. As a result, the memory cell cannot be avoided from being deteriorated. However, according to the configuration of the present invention, in comparison with the conventional method, the number of times of a write process performed by actually applying a write voltage to the same memory cell is reduced. In this manner, the life of each of the memory cells can be prolonged.

In a write process, the life of the memory cell can be prolonged by only comparing written data of a selected memory cell corresponding to a write destination address with write target data. More specifically, unlike in the conventional technique, the numbers of write times or orders of writing need not be managed. For this reason, the present invention can be applied to an RRAM in which data can be written (rewritten) in units of bits.

In the method of driving a nonvolatile semiconductor memory device according to the present invention having a memory cell array in which a plurality of memory cells each having a variable resistive element that stores information by a change in electric resistance are arranged in a row direction and a column direction, first terminals of the memory cells of the same row are connected to a common word line, and second terminals of the memory cells of the same column are connected to a common bit line, when a write target data is written in a target memory cell corresponding to a designated address, written data in the target memory cell is read first, the written data and the write target data are compared with each other, the writing in the target memory cell is not performed when a comparison result represents matching, and the write target data is written in the target memory cell when the comparison result represents mismatching.

Effect of the Invention

According to the configuration of the present invention, a nonvolatile semiconductor memory device that can prolong memory cell life without managing the number of rewritable times can be realized.

MODE FOR CARRYING OUT THE INVENTION

Embodiments of a nonvolatile semiconductor memory device according to the present invention and a driving method therefor will be described below with reference to the drawings.

In the embodiment, an explanation will be made on the assumption that a memory cell includes an RRAM element. As described in Background Art, an RRAM element is configured to store information by reversibly changing a resistance (or resistivity) by applying a voltage. For this reason, a write operation and an erase operation use the same principle of operation except that changed resistances in the operations are different from each other. More specifically, a "write operation" means that a voltage is applied such that a voltage condition is set to change a certain first resistance (first resistivity), and an "erase operation" means that a voltage is applied such that a voltage condition is set to change another second resistance (second resistivity). That is, the erase operation and the write operation are the same operations actually performed to the memory cell except that the voltage conditions are different from each other. For this reason, in the following description, it is considered that the "erase operation" is one mode of the "write operation", and it is assumed that the "write operation" and the "erase operation" are not discriminated in language from each other unless otherwise noted.

In contrast to this, the "read operation" is simply an operation in which a resistance (or resistivity) of an RRAM element at the present is read out without changing the resistance (or resistivity) of the RRAM element, and is different in operation content from the write operation in which a resistance (resistivity) is changed. For this reason, the "read operation" is expressed in distinction from the "write operation".

First Embodiment

A first embodiment (to be arbitrarily referred to as the "embodiment" hereinafter) of the present invention will be described below with reference to FIGS. 1 to 6.

Figure 1:
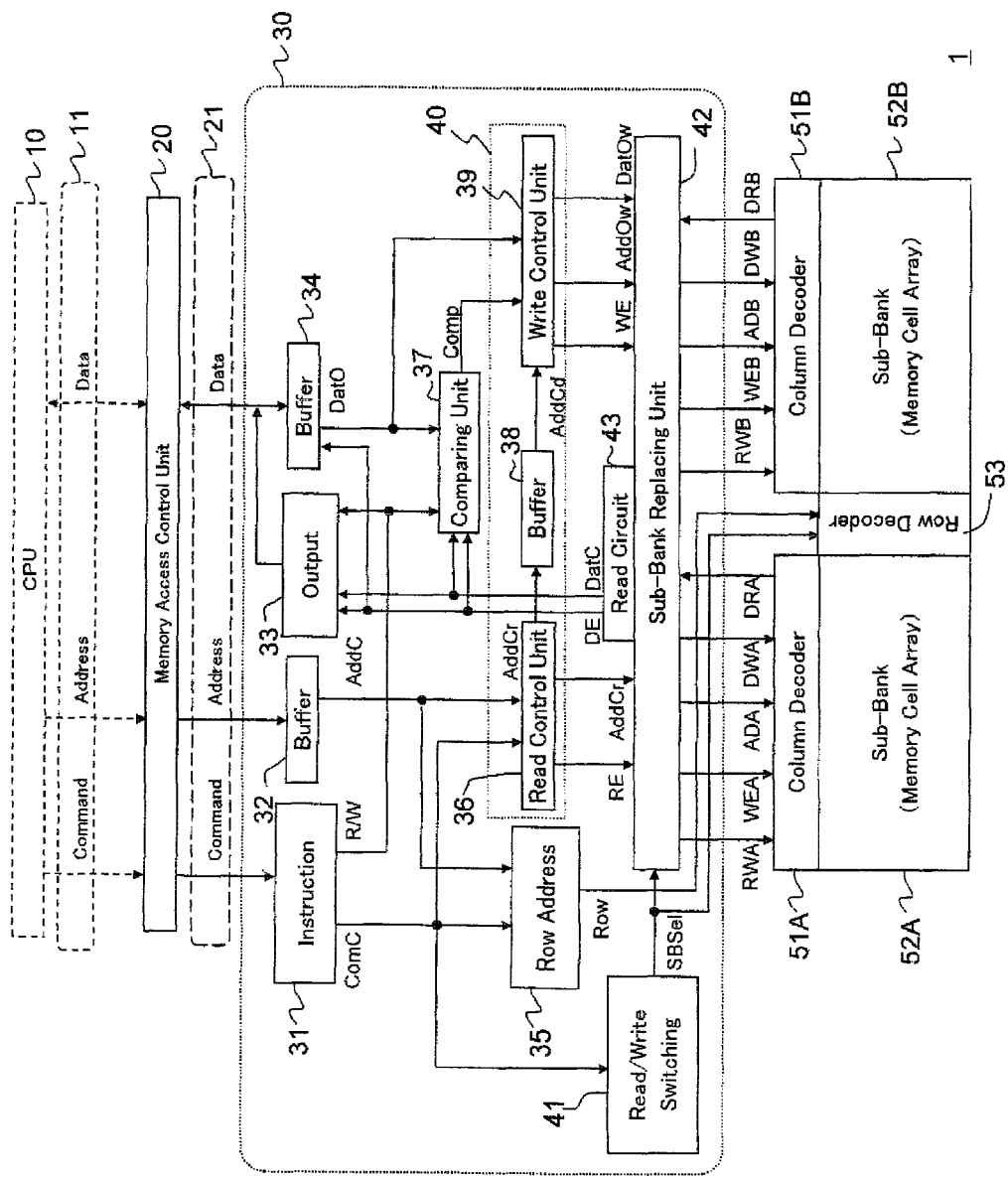
FIG. 1 is a block diagram showing a conceptual structure of a nonvolatile semiconductor memory device according to a first embodiment.

FIG. 1 is a block diagram showing a conceptual structure of a nonvolatile semiconductor memory device according to the embodiment. A nonvolatile semiconductor memory device 1 shown in FIG. 1 includes a memory access control unit 20, a memory control unit 30, a decoder unit (row decoder 53 and column decoders 51A and 51B), and memory cell arrays (52A and 52B). In the embodiment, one memory control unit 30 includes two sub-banks 52A and 52B. The sub-banks include column decoders (51A and 51B) each and share the row decoder (53).

Figure 2:
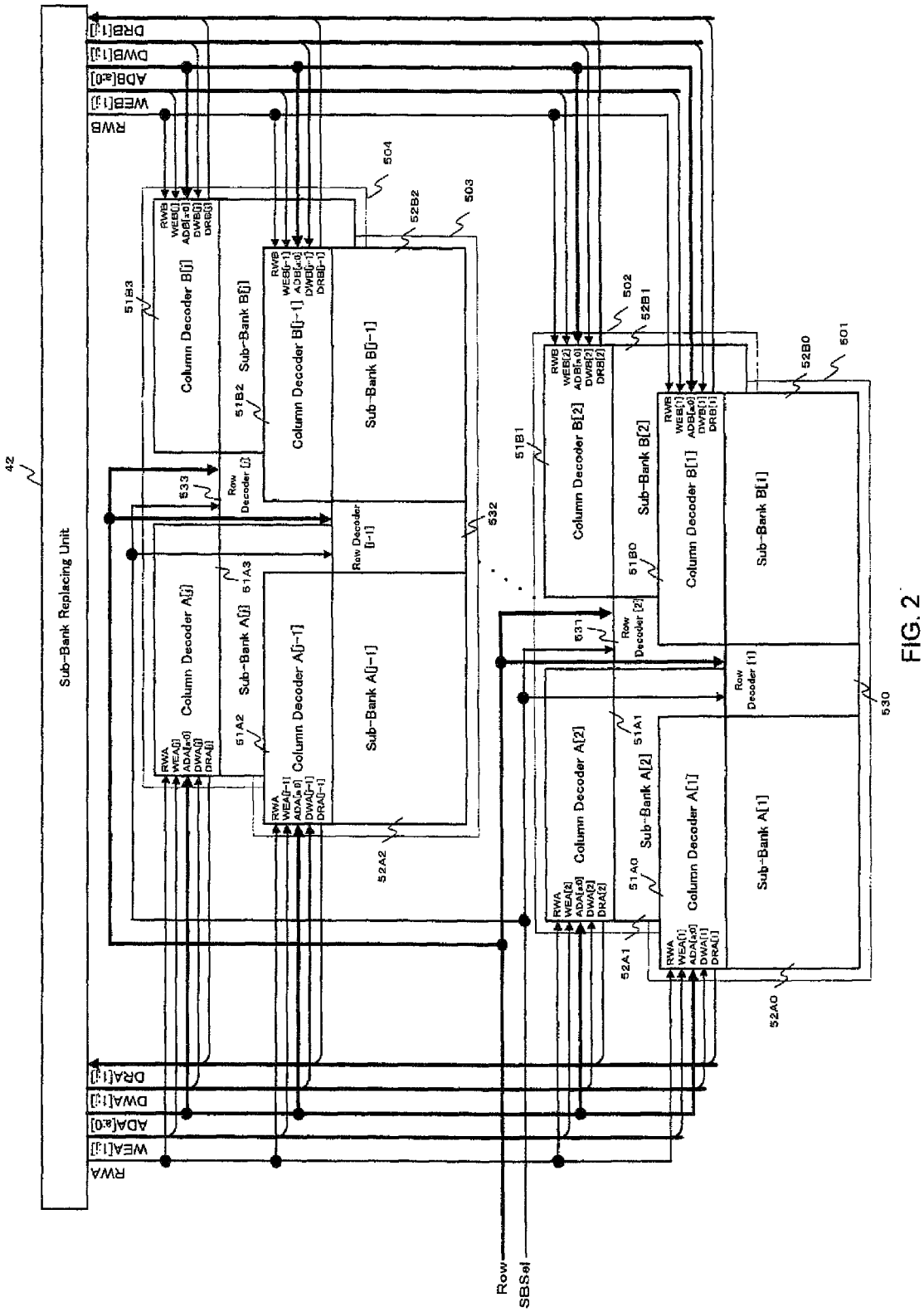
FIG. 2 is a block diagram showing another conceptual structure of a nonvolatile semiconductor memory device according to the first embodiment.

The decoder unit (row decoder 53 and column decoders 51A and 51B) in FIG. 1 and the sub-banks 52A and 52B (memory unit) are illustrated, for descriptive convenience, on the assumption that the decoder unit has 1-bit data for 1 address. When multi-bit data is to be handled, a configuration as shown in FIG. 2 is employed. In other words, the configuration in FIG. 1 is obtained by illustrating the plurality of memory units and the plurality of decoder units shown in FIG. 2 as one unit.

For descriptive convenience, an explanation will be made below on the assumption that 1-bit data is set for one address. Thereafter, with reference to FIG. 2, a case in which a mode in which multi-bit (j-bit) (j is a natural number which is 2 or more) data is set for one address is handled will be described below.

Returning to FIG. 1 again, an explanation will be described below. The memory control unit 30 includes an instruction interpreting unit 31, a buffer 32, an output control unit 33, a buffer 34, a row address buffer 35, a comparing unit 37, a write/read control unit 40 (read control unit 36, buffer 38, and write control unit 39), a read/write switching control unit 41, a sub-bank replacing unit 42, and a read circuit 43.

The memory access control unit 20 is configured to be able to exchange a signal with a CPU 10. The CPU 10 is a central processing unit that is connected to the memory access control unit 20 through a bus (CPU bus 11) that can transmit a command, an address, and data. The CPU bus 11 may be connected to not only the CPU 10 and the memory access control unit 20 but also a large number of hardware modules (not shown) such as a network, a storage, and a graphic.

The memory access control unit 20 recognizes pieces of information given from the CPU 10 and gives each piece of information to an appropriate element in the memory control unit 30 through a memory bus 21. More specifically, the memory access control unit 20 gives command information to the instruction interpreting unit 31, gives address information to the buffer 32, and gives data (write target data) to the buffer 34.

The memory control unit 30 converts the pieces of information (command and address) given by the memory access control unit 20 into commands (write and erase) or addresses (row/column address) to the sub-banks 52A and 52B to control the column decoders 51A and 51B and the row decoder 53.

The sub-banks 52A and 52B are memory cell arrays. The column decoders 51A and 51B and the row decoder 53 apply predetermined voltages to the memory cells in the memory cell array to perform read or write (erase) process.

Each of the sub-banks 52A and 52B is configured such that a plurality of memory cells having RRAM elements are arranged in a row direction and a column direction. The sub-bank includes a plurality of word lines extending in the row direction and a plurality of bit line extending in the column direction. One-end sides of the RRAM elements in the memory cells arranged on the same row are connected to the same word line through selecting transistors, and the other-end sides of the RRAM elements in the memory cells arranged on the same column are connected to the same bit line. As an example of the sub-banks 52A and 52B, a 1T1R type structure in which each of the memory cells is configured by an RRAM element and a selecting transistor connected in series with the element is shown in FIG. 3.

Figure 3:
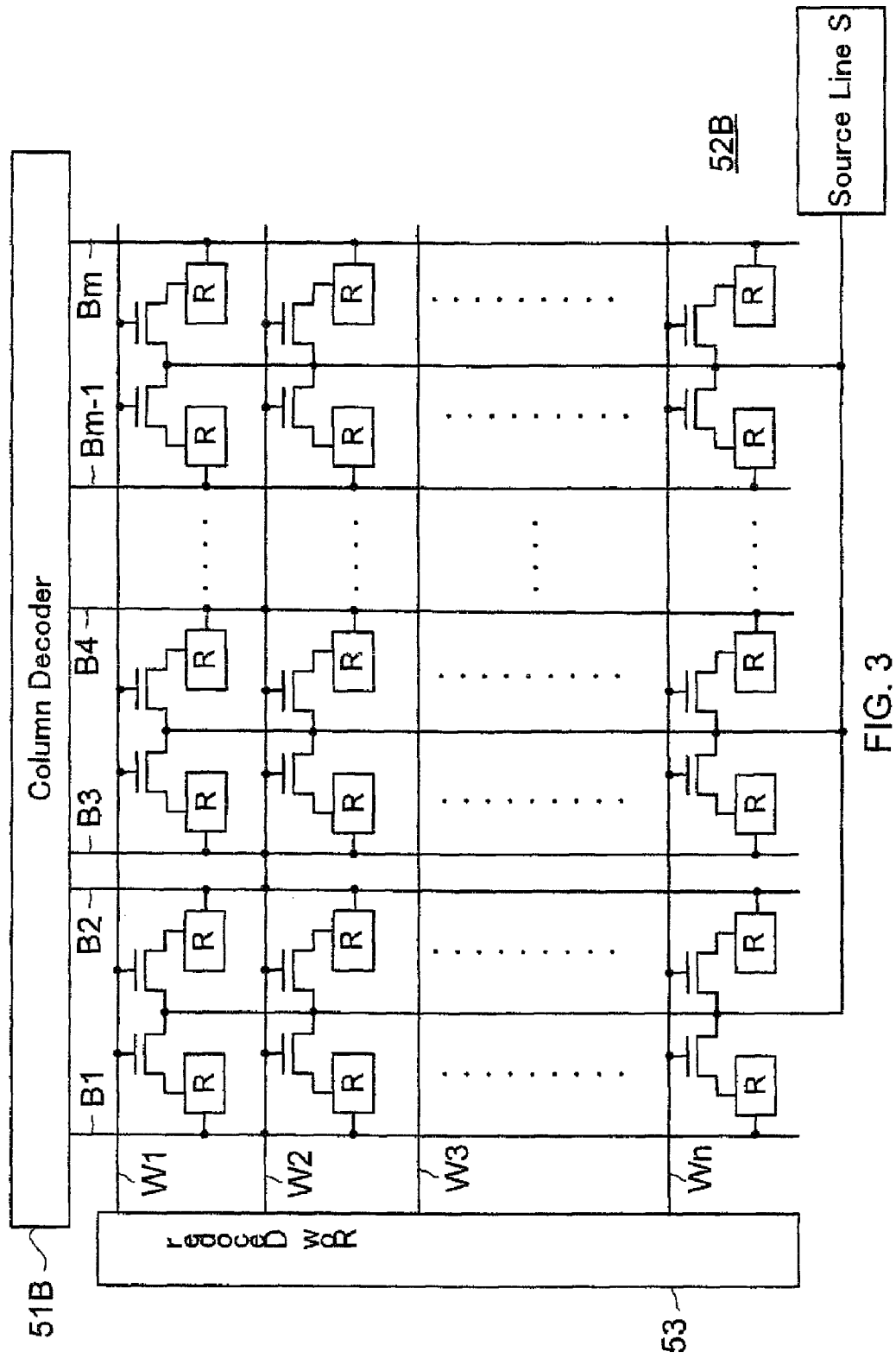
FIG. 3 is a circuit diagram showing a configuration of a sub-bank.

FIG. 3 is a circuit diagram showing a configuration of the sub-bank 52B. Each memory cell has a so-called 1T1R configuration having one selecting transistor and one variable resistive element R. In FIG. 3, a gate of a selecting transistor of each memory cell is connected to word lines (W1 to Wn), and each of the word lines is connected to the row decoder 53. Sources of the selecting transistors of the memory cells are connected to a common source line through a source line SL. One end (upper electrode side) of the variable resistive element R of each of the memory cells is connected to bit lines (B1 to Bm), and each of the bit lines is connected to the column decoder 51B. Reference symbols n and m denote natural numbers, respectively. The sub-bank 52A has the same configuration as described above.

In the embodiment, it is assumed that address allocation is performed such that memory addresses are alternately serial between the sub-banks 52A and 52B. More specifically, an even-number address is allocated to the sub-bank 52A, and an odd-number address is allocated to the sub-bank 52B.

Returning to FIG. 1 again, the instruction interpreting unit 31 converts an input command into a command having a form conforming to the embodiment, and transmits the command to the read control unit 36, the read/write switching control unit 41, and the row address buffer 35. More specifically, when a write (erase) command "W" is input, the instruction interpreting unit 31 gives a read command "R" to the read control unit 36 and the read/write switching control unit 41 by a signal ComC and activates (High state) a signal R/W to give the signal R/W to the output control unit 33 and the comparing unit 37. When the read command "R" is input, the instruction interpreting unit 31 gives the read command "R" to the read control unit 36 and the read/write switching control unit 41 by the signal ComC and inactivates (Low state) the signal R/W. That is, even though a write (erase) command "W" is given, even though the read command "R" is given, the instruction interpreting unit 31 gives the read command "R" to the row address buffer 35, the read control unit 36, and the read/write switching control unit 41 by the signal ComC. In addition, a "row address designation" command (to be referred to as an "A" command hereinafter) may be input to the instruction interpreting unit 31. The "A" command is designed to be input from the memory access control unit 20 when a row address value is input to the buffer 32. When this is input, the instruction interpreting unit 31 gives the "A" command to the row address buffer 35 by the signal ComC.

The buffer 32 is an FIFO (First In First Out) buffer that temporarily stores input address information. In synchronization with outputting of the signal ComC from the instruction interpreting unit 31, a signal AddC representing address information is output to the row address buffer 35 and the read control unit 36. The buffer 32 is not always an FIFO. The buffer 32 may receive an address value as a buffer of one address only when a command is input.

In synchronization with a timing at which the instruction interpreting unit 31 outputs a command, the instruction interpreting unit 31 and the buffer 32 are connected to each other through a signal line (not shown). The signal line may be designed to be activated when the instruction interpreting unit 31 outputs a command. In this case, due to rising of the signal line, the buffer 32 may output the signal AddC representing address information.

The buffer 34 is an FIFO buffer like the buffer 32. In the embodiment, as will be described later, after a write command is input, a predetermined time is required until actual writing in the sub-banks 52A and 52B is started. The buffer 34 represents a function of holding write target data for a time required until actual writing in the sub-banks 52A and 52B is started after the write command is input. After the buffer 34 holds the write target data for the predetermined period of time, the write target data is output from the buffer 34 to the comparing unit 37 and the write control unit 39 as a signal DatO.

When a command given from the instruction interpreting unit 31 by the signal ComC is "R", the read control unit 36 calculates data read address AddCr based on an address designated from the buffer 32 by the signal AddC and outputs the read address AddCr to the sub-bank replacing unit 42. When setting of memory access is burst (data is continuously read or written at a plurality of addresses), addresses of a set burst length (the number of times of continuous reading and writing of data) are sequentially calculated and output to one address designated from the buffer 32. The burst length is a value set for the memory by a host such as the CPU 10 connected to the memory. As a method of setting the burst length, any method may be used. An explanation of the method is omitted because the explanation departs from the spirit and scope of the invention.

The read control unit 36 gives a signal RE to be "High" while a valid address value is output to the sub-bank replacing unit 42, otherwise, gives the signal RE to be "Low" to the sub-bank replacing unit 42.

The comparing unit 37 receives the R/W signal from the instruction interpreting unit 31. When the R/W signal is active, the comparing unit 37 compares DatO given from the buffer 34 with DatC given from the read circuit 43 and gives a comparison result Comp to the write control unit 39. As will be described below, when the DatC and DatO are multi-bit data, the comparison is performed in units of bits, and matching/mismatching in units of bits are given to the write control unit 39. That is, when a bit width of data is 8 bits, a bit width of Comp is also 8 bits. When a bit width of data is 32 bits, the bit width of Comp is also 32 bits. When the R/W signal is inactive, nothing is done.

When the read/write switching control unit 41 receives the command "R" given from the instruction interpreting unit 31 by the signal ComC, the read/write switching control unit 41 generates a signal SBSel to switch reading and writing of the sub-bank 52A and the sub-bank 52B to supply the signal to the sub-bank replacing unit 42 and the row decoder 53. As described above, in the embodiment, an even-number address is allocated to the sub-bank 52A, and an odd-number address is allocated to the sub-bank 52B. More specifically, serial addresses are alternately allocated to the sub-banks 52A and 52B.

In this case, the signal SBSel is set to a signal level "Low" when reading is performed from the sub-bank 52A and set to a signal level "High" when reading is performed from the sub-bank 52B. More specifically, when the signal SBSel is set at "Low", a read process is performed to the sub-bank 52A serving as a read target, and a write process is performed to the sub-bank 52B different from the sub-bank 52A. In contrast to this, when the signal SBSel is set at "High", a read process is performed to the sub-bank 52B serving as a read target, and a write process is performed to the sub-bank 52A different from the sub-bank 52B.

When the row address buffer 35 receives the "A" command from the instruction interpreting unit 31, the row address buffer 35 holds an address value given from the buffer 32 therein. Immediately after the operation, when a read command "R" or a write command "W" is received, the held address value is output to the row decoder 53 as a signal Row at an appropriate timing. The appropriate timing mentioned here is a timing before access time to the memory cells in the sub-banks 52A and 52B indicated by the row addresses.

The buffer 38 is an FIFO buffer that is used when an address value represented by the signal AddCr output from the read control unit 36 is given to the write control unit 39 as a signal AddCd at an appropriate timing. The appropriate timing mentioned here is a timing synchronized with a timing at which the comparing unit 37 (will be described later) outputs a comparison result as a signal Comp.

The write control unit 39 receives the comparison result (signal Comp) from the comparing unit 37 and outputs a write instruction (signals WE, AddOw, and DatOw) to a bit that needs to be rewritten to the sub-bank replacing unit 42. The signal DatOw represents write target data that indicates the same contents as those of the signal DatO given from the buffer 34. The signal WE is a signal representing whether writing is necessary or not. The signal AddOw represents a column address and is a signal representing the same contents as those of an address value AddCd given from the buffer 38. An output timing of the signal AddOw is synchronized with the signal WE.

The output control unit 33 is means for controlling whether data (signal DatC) read from the read circuit 43 is output to the memory bus 21. More specifically, when the signal R/W given from the instruction interpreting unit 31 is active (High state), the data given from the read circuit 43 is not output to the memory bus 21. In contrast to this, when the signal R/W given from the instruction interpreting unit 31 is inactive (Low state), data given from the read circuit 43 is output to the memory bus 21. In other words, when a command given from the memory access control unit 20 is "W", data given from the read circuit 43 is not output to the memory bus 21. When the command is "R", data given from the read circuit 43 is output to the memory bus 21. It is shown by an active (High) signal DE that data is output from the read circuit 43 to the DatC.

The sub-bank replacing unit 42 switches writing and reading to the sub-banks 52A and 52B. More specifically, when the signal SBSel given from the read/write switching control unit 41 is "Low", the sub-bank replacing unit 42 outputs instructions to perform reading in the sub-bank 52A and to perform writing in the sub-bank 52B. In contrast to this, when the signal SBSel is "High", the sub-bank replacing unit 42 outputs instructions to perform reading in the sub-bank 52B and to perform writing in the sub-bank 52A. At this time, the reading is performed based on the signals RE and AddCr from the read control unit 36, and the writing is performed based on the signals WE, AddOw, and DatOw from the write control unit 39.

The sub-bank replacing unit 42 outputs a read instruction only when the signal RE given from the read control unit 36 is "High". As described above, depending on the value of the signal SBSel given from the read/write switching control unit 41, whether reading is performed in the sub-bank 52A or the sub-bank 52B is determined. More specifically, when the signal SBSel is "Low", a read instruction is output to the column decoder 51A to read data recorded on the sub-bank 52A by the read circuit 43. In contrast to this, when the signal SBSel is "High", a read instruction is output to the column decoder 51B to read data recorded on the sub-bank 52B. At this time, reading is performed to a memory cell corresponding to an address designated by the signal AddCr given from the read control unit 36.

The sub-bank replacing unit 42 outputs a write instruction only for a "High" bit of the signal WE given from the write control unit 39 to execute a write operation to the bit. As described above, depending on the value of the signal SBSel given from the read/write switching control unit 41, whether writing is performed in the sub-bank 52A or the sub-bank 52B is determined. More specifically, when the signal SBSel is "Low", a write instruction is output to the column decoder 51B to write data in the sub-bank 52B. In contrast to this, when the signal SBSel is "High", a write instruction is output to the column decoder 51A to write data in the sub-bank 52A. At this time, in a memory cell corresponding to an address designated by the signal AddOw given from the write control unit 39, write target data designated by the signal DatOw given from the write control unit 39 is written.

The row decoder 53 switches controls to the sub-bank 52A and the sub-bank 52B depending on the signal SBSel given from the read/write switching control unit 41. More specifically, when the signal SBSel is "Low", control for reading is performed to the sub-bank 52A, and control for writing is performed to the sub-bank 52B. When the signal SBSel is "High", control for writing is performed to the sub-bank 52A, and control for reading is performed to the sub-bank 52B.

A procedure of a concrete write operation will be described below with reference to the timing chart in FIG. 4.

Figure 4:
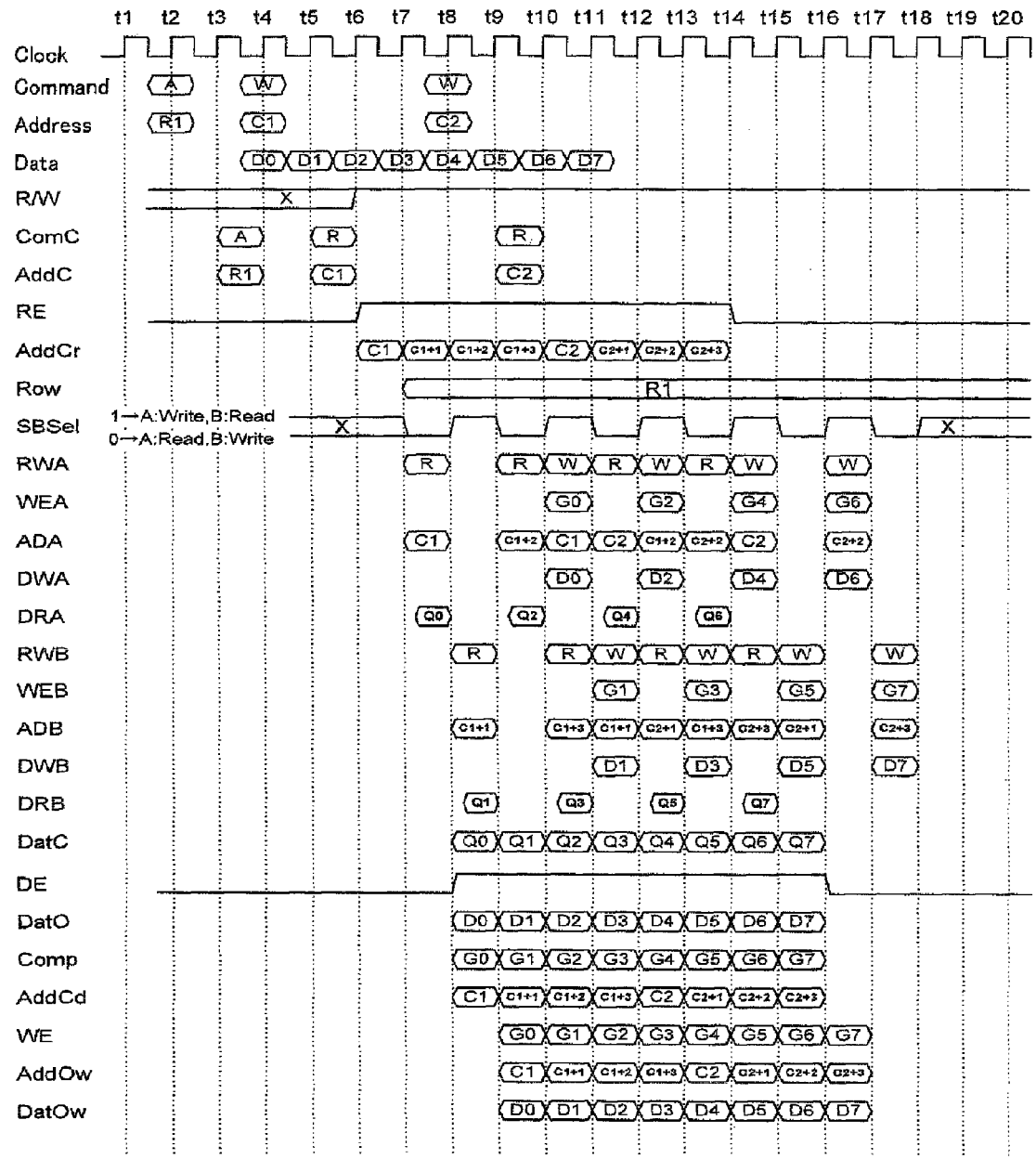
FIG. 4 is a timing chart obtained when burst writing is performed to the nonvolatile semiconductor memory device according to the first embodiment.

FIG. 4 is a timing chart showing a procedure of a burst write process to the nonvolatile semiconductor memory device (memory) according to the embodiment. In FIG. 4, it is assumed that a burst length is 4 in a clock synchronous type memory. Reference symbols t1 to t20 described in an upper part in FIG. 4 denote clock rising times, respectively. A latency time from a command input to reading and writing on a sub-bank is a design item and is not an element limited in FIG. 4.

When a row address designation command "A" and a row address "R1" are given to the memory control unit 30 (time t2), the instruction interpreting unit 31 that receives the command "A" transmits the command "A" to the row address buffer 35 by the signal ComC at an appropriate timing (for example, from t3 to t4). The row address "R1" is temporarily taken in the buffer 32 and then output to the row address buffer 35 and the read control unit 36 as the signal AddC in synchronization with the output of the command "A" as the signal ComC. The row address buffer 35 holds the row address "R1" input as the signal AddC in the buffer therein by using the command "A" input as the signal ComC as a trigger.

Subsequently, when the write command "W" and a designation address "C1" are given to the memory control unit 30 (time t4), the instruction interpreting unit 31 that receives the command "W" outputs the command "R" as the signal ComC to the read control unit 36 and the read/write switching control unit 41 at an appropriate timing (for example, from t5 to t6). The address "C1" is temporarily held in the buffer 32 and then output as the signal AddC to the read control unit 36 in synchronization with outputting of the command "R" from the instruction interpreting unit 31 as the signal ComC. The read control unit 36 holds the address "C1" input as the signal AddC in the buffer therein by using the command "R" input as the signal ComC as a trigger. The instruction interpreting unit 31 sets the signal R/W to a "High" level at an appropriate timing. In FIG. 4, the signal R/W is set to a "High" level by using a timing at which the instruction interpreting unit 31 outputs the command "R" to the signal ComC as a trigger.

Each time the read control unit 36 receives the command "R", the read control unit 36 outputs serial address values corresponding to a burst length to the sub-bank replacing unit 42 as the signal AddCr. In this case, since the burst length is 4, serial address values corresponding to four times are output from the read control unit 36 to the sub-bank replacing unit 42 for the signal AddCr. More specifically, the read control unit 36 receives the "R" command in a period from t5 to t6. As a result, the read control unit 36 outputs addresses "C1", "C1+1", "C1+2", and "C1+3" as the signal AddCr for a period from t6 to t10. While the address is output, the read control unit 36 outputs the signal RE at "High" level.

The memory control unit 30 receives an input of write target data at the same time in synchronism with inputting of the "W" command (time t4). Since the burst length is 4 in the example described in the embodiment, four write target data (D0, D1, D2, and D3) are input for one "W" command (time t4 to time t7). The input write target data are temporarily held in the buffer 34 after time t8 until the comparing unit 37 compares the write target data with the written data read from the sub-bank 52A or 52B.

In the timing chart in FIG. 4, since access to the sub-bank is started at time t7, at this time, the row address buffer 35 supplies a signal Row representing the row address "R1" to the row decoder 53 to activate the row address line. As a matter of course, the row address line may be activated at a timing earlier than the time t7. However, when similar accesses are continued, the timing can preferably shorten an access interval.

After time t7, based on the signal RE (corresponding to a read trigger signal) given from the read control unit 36 and the signal AddCr (corresponding to a read designation address signal), the sub-bank replacing unit 42 starts a read process for the sub-banks 52A and 52B through the column decoders 51A and 51B. The sub-bank replacing unit 42 distributes the read target sub-banks to the sub-banks 52A and 52B by the value (High/Low) of the signal SBSel input from the read/write switching control unit 41. By the process of the sub-bank replacing unit 42, the read processes from the sub-banks 52A and 52B are alternately performed. More specifically, when the signal SBSel is "Low", the sub-bank replacing unit 42 instructs the column decoder 51A to read data. In this manner, the read circuit 43 reads the written data from the sub-bank 52A. When the signal SBSel is "High", the sub-bank replacing unit 42 instructs the column decoder 51B to read data. In this manner, the read circuit 43 reads the written data from the sub-bank 52B.

In the embodiment, since the serial addresses are alternately allocated to the sub-bank 52A and the sub-bank 52B, addresses C1 and C1+C2 are present in one sub-bank, and addresses C1+1 and C1+3 are present in another sub-bank. In this case, the following explanation will be made on the assumption that addresses C1 and C1+2 are present in sub-bank 52A and addresses C1+1 and C1+3 are present in the sub-bank 52B.

Between the sub-bank replacing unit 42 and the column decoder 51A, signals RWA, WEA, ADA, DWA, and DRA are exchanged. The signal RWA is a signal representing reading or writing, and the signal ADA is a signal representing a column address at which writing is performed. The signal DWA is a signal representing data to be written (write target data), and the signal WEA is a signal representing whether data is written. The signal WEA, as described here, may not be present when one address has only 1-bit data. As will be described later, when multi-bit data is used, the signal WEA plays a role to represent a bit to be written. These four signals are output from the sub-bank replacing unit 42 to the column decoder 51A.

The signal DRA is a signal representing written data read from the sub-bank 52A, and is output from the column decoder 51A to the sub-bank replacing unit 42. The signal DRA is a weak signal obtained before amplification. Thereafter, the signal is amplified by the read circuit 43 and output as the written data DatC.

When the signal RWA is "R", the column decoder 51A applies a voltage to read the written data stored at an address designated by the signal ADA, and the written data is output to the sub-bank replacing unit 42 as the signal DRA. When the signal RWA is "W", the column decoder 51A applies a voltage to write the write target data input as the signal DWA at the address designated by the signal ADA. At this time, the signal WEA determines whether writing is performed. For example, when the signal DWA (write data) has an 8-bit width, if the signal WEA has a value of "00000001", only a least significant bit of the signal DWA is a bit to be written, and the remaining 7 bits are bits not to be written.

Even between the sub-bank replacing unit 42 and the column decoder 51B, as between the sub-bank replacing unit 42 and the column decoder 51A, signals RWB, WEB, ADB, DWB, and DRB are exchanged. The signal RWB is a signal representing reading or writing, and the signal ADB is a signal representing a column address at which writing is performed. The signal DWB is a signal representing data to be written (write target data), and the signal WEB is a signal representing whether data is written. Like the signal WEA, as described here, the signal WEB may not be present when one address has only 1-bit data. As will be described later, when multi-bit data is used, the signal WEB plays a role to represent a bit to be written. These four signals are output from the sub-bank replacing unit 42 to the column decoder 51B. The signal DRB is a signal representing written data read from the sub-bank 52B, and is output from the column decoder 51B to the sub-bank replacing unit 42. The signal DRB is a weak signal obtained before amplification. Thereafter, the signal is amplified by the read circuit 43 and output as the written data DatC.

The column decoders 51A and 51B are blocks having the same functions.

The sub-bank replacing unit 42 gives a read instruction to the column decoder 51A or 51B while the signal RE is at "High". In time t7 to time t8, since the signal SBSel is at "Low", the sub-bank replacing unit 42 instructs the column decoder 51A to read the written data in a memory cell corresponding to an address C1 designated by the signal AddCr. At this time, a row address (row address R1 designated by the signal Row) designated by the row decoder 53 is active. Within the period from time t7 to time t8, the column decoder 51A transmits the written data in the memory cell corresponding to the address C1 from the sub-bank 52A to the sub-bank replacing unit 42 as the signal DRA.

In time t8 to time t9, since the signal SBSel is at "High", the sub-bank replacing unit 42 instructs the column decoder 51B to read the written data in a memory cell corresponding to an address C1+1 designated by the signal AddCr. At this time, a row address (row address R1 designated by the signal Row) designated by the row decoder 53 is active. Within the period from time t8 to time t9, the column decoder 51B transmits the written data in the memory cell corresponding to the address C1+1 from the sub-bank 52B to the sub-bank replacing unit 42 as the signal DRB.

By the same procedure as described above, in time t9 to time t10, the column decoder 51A transmits written data in a memory cell corresponding to an address C1+2 from the sub-bank 52A to the sub-bank replacing unit 42 as the signal DRA. In time t10 to time t11, the column decoder 51B transmits the written data in a memory cell corresponding to the address C1+3 from the sub-bank 52B to the sub-bank replacing unit 42 as the signal DRB.

When the signal R/W given from the instruction interpreting unit 31 is at "High", the comparing unit 37 compares the written data represented by the signal DatC given from the read circuit 43 with the write target data represented by the signal DatO given from the buffer 34 to output a comparison result to the write control unit 39 as the signal Comp.

In FIG. 4, in time t8 to time t12, read data (Q0 to Q3) merged by the sub-bank replacing unit 42 are output from the read circuit 43 to the comparing unit 37 as the signal DatC. The signal DE is active (High) while the data is output from the signal DatC. More specifically, it can be recognized by the signal DE that the data is output from the signal DatC. The signal DE is input to the buffer 34. In this manner, in synchronization with inputting of the signal DatC to the comparing unit 37, the write target data DatO is input from the buffer 34 to the comparing unit 37 (t8 to t12). The signal DE is also input to the comparing unit 37. When the signal DE is active, the comparing unit 37 performs a comparing operation of the write target data DatO with the written data DatC to output a comparison result as the signal Comp. More specifically, in time t8 to time t9, written data "Q0" is compared with write target data "D0" to output data "G0" representing the result to the write control unit 39.

Written data read by shifting addresses one by one are compared with the write target data at corresponding addresses. In time t9 to time t10, "D1" and "Q1" are compared with each other to set a comparison result as "G1". In time t10 to time t11, "D2" and "Q2" are compared with each other to set a comparison result as "G2". In time t11 to time t12, "D3" and "Q3" are compared with each other to set a comparison result as "G3". More specifically, the comparing unit 37, in time t8 to time t12, outputs comparison results between the written data DatC (Q0 to Q3) and the write target data DatO (D0 to D3) to the write control unit 39 as signals Comp (G0 to G3).

The write control unit 39 performs data write control to the sub-bank replacing unit 42 based on the data of the signal Comp input from the comparing unit 37. More specifically, the write control unit 39 outputs an instruction to write a bit designated from the comparing unit 37 among the write target data held in the buffer 34 to an address held in the buffer 38. At this time, the write control unit 39 outputs the signal AddOw, the signal WE, and the signal DatOw designating an address, a write bit, and write target data, respectively, to the sub-bank replacing unit 42 (in time t9 to time t13). The signal WE representing a write bit is generated based on the signal Comp given from the comparing unit 37. As will be described later, when multi-bit data is used, only a bit at which a comparison result between the written data and the write target data represents mismatching is designated as a write bit.

When the sub-bank replacing unit 42 receives the data write instruction from the write control unit 39, the sub-bank replacing unit 42 instructs the column decoders 51A and 51B to write data (in time t10 to time t14). At this time, while a read process is performed to one column decoder, a write instruction is given to another column decoder. More specifically, for example, in time t10 to time t11, a write instruction is given to the column decoder 51A. In time t11 to time t12, a write instruction is given to the column decoder 51B. In this manner, in time t10 to time t11 in which a read instruction is given to the column decoder 51B, a write instruction is given to the column decoder 51A. In time t11 to time t12 in which a read instruction is given to the column decoder 51A, a write instruction is given to the column decoder 51B.

In this manner, write target data (D0 to D3) corresponding to the "W" command input at time t4 are completely written in the sub-banks in time t10 to time t14 (or the same written data is directly used). The same process as described above is also performed to the write target data (D4 to D7) corresponding to the "W" command input at time t8. At this time, referring to FIG. 4, subsequent to timing in time t13 to time t14 in which writing of the data D3 is completed, data D4 is written in the sub-bank 51A in time t14 to time t15. More specifically, even though the write commands "W" are continuously input to the memory control unit 30 (at burst-length intervals), a time lag does not occur. In this manner, a writing rate does not become low.

A procedure of a concrete read operation will be described below with reference to the timing chart in FIG. 5. As in FIG. 4, in FIG. 5, a case in which a burst length is 4 is exemplified. The read operation may be considered such that, in the write operation procedure shown in FIG. 4, the comparing process by the comparing unit 37, the write instruction by the write control unit 39 and the sub-bank replacing unit 42, and the write process by both the column decoders 51A and 51B are not performed.

When the row address designation command "A" and the row address "R1" are given to the memory control unit 30 (time t2), as in the write operation, the instruction interpreting unit 31 that receives the command "A" transmits the command "A" to the row address buffer 35 as the signal ComC at an appropriate timing (for example, in time t3 to time t4). The row address "R1" is temporarily taken in the buffer 32 and then output to the row address buffer 35 and the read control unit 36 as the signal AddC in synchronization with the output of the command "A" as the signal ComC. The row address buffer 35 holds the row address "R1" input as the signal AddC in the buffer therein by using the command "A" input as the signal ComC as a trigger.

Subsequently, when the read command "R" and a designation address "C1" are given to the memory control unit 30 (time t4), the instruction interpreting unit 31 that receives the command "R" outputs the command "R" as the signal ComC to the read control unit 36 and the read/write switching control unit 41 at an appropriate timing (for example, from t5 to t6). The address "C1" is temporarily held in the buffer 32 and then output as the signal AddC to the read control unit 36 in synchronization with outputting of the command "R" as the signal ComC. The read control unit 36 holds the address "C1" input as the signal AddC in the buffer therein by using the command "R" input as the signal ComC as a trigger. However, the instruction interpreting unit 31 outputs a signal R/W at "Low" level unlike in the write operation because the input command is the read command "R". The signal R/W may be kept at "Low" level until the write command "W" is input to, for example, the instruction interpreting unit 31.

As in the write operation, each time the read control unit 36 receives the command "R", the read control unit 36 outputs serial address values corresponding to a burst length to the sub-bank replacing unit 42 as the signal AddCr. As in the write operation, when the burst length is set to 4, to an "R" command received in time t5 to time t6 described above, addresses "C1", "C1+1", "C1+2", and "C1+3" are output in time t6 to time t10. While the address is output, the read control unit 36 outputs the signal RE at "High" level.

After time t7, as in the write process, based on the signal RE (corresponding to a read trigger signal) given from the read control unit 36 and the signal AddCr (corresponding to a read designation address signal), a read process to the sub-banks 52A and 52B is started through the sub-bank replacing unit 42 and the column decoders 51A and 51B. The sub-bank replacing unit 42 distributes the read target sub-banks to the sub-banks 52A and 52B by the value (High/Low) of the signal SBSel input from the read/write switching control unit 41. In this manner, read processes from the sub-banks 52A and 52B are alternately performed. The read data is given to the read circuit 43 through the sub-bank replacing unit 42, subjected to an amplifying process here, and transmitted to the output control unit 33 as the signal DatC (time t8 to time t12). It is shown by an active (High) signal DE that data is output from the signal DatC. The output control unit 33 recognizes that the input signal R/W is at "Low" level and transmits the input signal DatC to the memory bus 21.

On the other hand, when the comparing unit 37 recognizes that the input signal R/W is at "Low" level, the comparing unit 37 does not execute a comparing process. Due to the read process, as a matter of course, write target data is not input. For this reason, the signal DatO is not input to the comparing unit 37.

Subsequent to time t4, also when the read command "R" and read row address "C2" are input at time t8, read instructions of the memory cells related to addresses "C2", "C2+1", "C2+2", and "C2+3" in the sub-banks are output in time t11 to time t15. In this manner, data at the address positions are read in time t12 to time t16. More specifically, even though the read commands "R" are continuously input to the memory control unit 30 (at burst-length intervals), a time lag does not occur in reading. In this manner, a reading rate does not become low. Similarly, when the write command "W" is input after the read command "R" is input, or in the opposite state, a time lag does not occur.

As described above, in the configuration described in the embodiment, when the write command "W" is given, before a write process is actually performed to a memory cell, written data is read from a write target memory cell to compare the written data with the write target data. Only when the comparison result represents mismatching, a write process of write target data is performed to the memory cell. When the comparison result represents matching, the write process is not performed. Therefore, in comparison with a conventional write process, the number of times of a write process in which a write voltage is actually applied to the same memory cell is decreased. In this manner, the life of each of the memory cells can be prolonged.

As described above, while the written data and the write target data are compared with each other for one sub-bank, a write process can be performed by applying a write voltage to another sub-bank. For this reason, a time lag does not occur in the write process. For this reason, the life of a memory cell can be advantageously prolonged without extending time required for the write process in comparison with the time required in the conventional method.

In the configuration of the embodiment, in a write process, by simply comparing written data in a memory cell related to a write target address with write target data, the life of the memory cell can be prolonged. More specifically, unlike in the conventional technique, the numbers of write times or orders of writing need not be managed. For this reason, the present invention can be easily applied to an RRAM that can perform writing (rewriting) in units of bits.

In the embodiment, an even-number address is allocated to the sub-bank 52A, and an odd-number address is allocated to the sub-bank 52B. However, the odd-number address and the even-number address may be reversed. Furthermore, series addresses need not be alternately allocated to sub-banks, and every two addresses or four addresses, i.e., a plurality of addresses may be alternately allocated to sub-banks. In this case, the number of addresses may be an aliquot of the burst length. In the following second embodiment, the same is applied.

In the embodiment, it is an example whether each signal level is "High" or "Low". The levels may be reversed. For example, when the signal SBSel is at "Low", reading from the sub-bank 52B may be instructed, and writing in the sub-bank 52A may be instructed. In contrast to this, when the signal SBSel is at "High", reading from the sub-bank 52A may be instructed, and writing in the sub-bank 52B may be instructed. The same is applied to the other signals.

In the embodiment described above, an outline of the operation has been described with reference to FIG. 1. A case in which j-bit data is used will be described below with reference to FIG. 2.

A configuration shown in FIG. 2 includes, in place of the decoder unit (row decoder 53 and column decoders 51A and 51B) and the sub-banks 52A and 52B in FIG. 1, j units (to be referred to as memory units hereinafter) each having a row decoder, a column decoder A, a column decoder B, a sub-bank A, and a sub-bank B.

In FIG. 2, reference symbols 52A0, 52A1, 52A2, 52A3, 52B0, 52B1, 52B2, and 52B3 denote sub-banks, reference symbols 51A0, 51A1, 51A2, 51A3, 51B0, 51B1, 51B2, and 51B3 denote column decoders, and reference numerals 530, 531, 532, and 533 denote row decoders, respectively. Sub-banks 52A0, 52A1, 52A2, and 52A3 are called sub-banks A, and sub-banks 52B0, 52B1, 52B2, and 52B3 are called sub-banks B. Similarly, column decoders 51A0, 51A1, 51A2, and 51A3 are called column decoders A, and column decoders 51B0, 51B1, 51B2, and 51B3 are called column decoders B, respectively. In FIG. 2, reference numerals 501, 502, 503, and 504 denote memory units each including the sub-banks A and B as one pair.

As shown in FIG. 2, in an apparatus including the j memory units, a signal changed into a multi-bit signal in the memory control unit 30 in FIG. 1 will be mentioned. Basically, a bit width of a data bus is changed into a multi-bit (j-bit) data bus. The control signal is changed into a multi-bit (j-bit) signal. More specifically, data connected to the memory bus 21, a signal DatO from the buffer 34, and DatC output from the read circuit 43, an output Comp from the comparing unit 37 that is a result obtained by comparing DatO and DatC with each other, an output DatOw from the write control unit 39, write enable WE thereof, output (write) data DWA and DWB from the sub-bank replacing unit 42, write enable WEA and WEB, and input (read) data DRA and DRB of the sub-bank replacing unit 42 are changed into multi-bit data and signals, respectively. Bits of the data Comp, WE, WEA, and WEB correspond to bits of corresponding data DatO, DatC, DatOw, DWA, and DWB, respectively. More specifically, a comparison result between the least significant bits of the signals DatO and DatC is represented by the least significant bit of the signal Comp, and write enable of the highest-order bit of the signal DatOw is represented by the highest-order bit of the signal WEA.

Connections of signal lines in FIG. 2 will be described below. Signal lines Row and SBSel (signal line in which signals Row and SBSel flow) are connected to all first to j-th row decoders. This shows that, between the memory units, switching control of a row address and reading/writing is performed based on the same signal. To k-th (k is a natural number from 1 to j) column decoder A, a signal line in which the read/write command RWA, the write enable WEA [k], the column address ADA, the write data DWA [k], and the read data DRA [k] are caused to flow is connected. This shows the follows. The same read/write command RWA and the same column address ADA are given to all the column decoders A. When the read/write command RWA represents "W (write)", the write data DWA [k] is written in only a memory unit in which the WEA [k] is active. When the read/write command RWA represents "R (read)", the read data DRA [k] is read from only a memory unit in which the WEA [k] is active. The same as that in the column decoder A is applied to the column decoder B. More specifically, the first to j-th memory units correspond to first to j-th bits of the data and the data control line, respectively.

Figure 5:
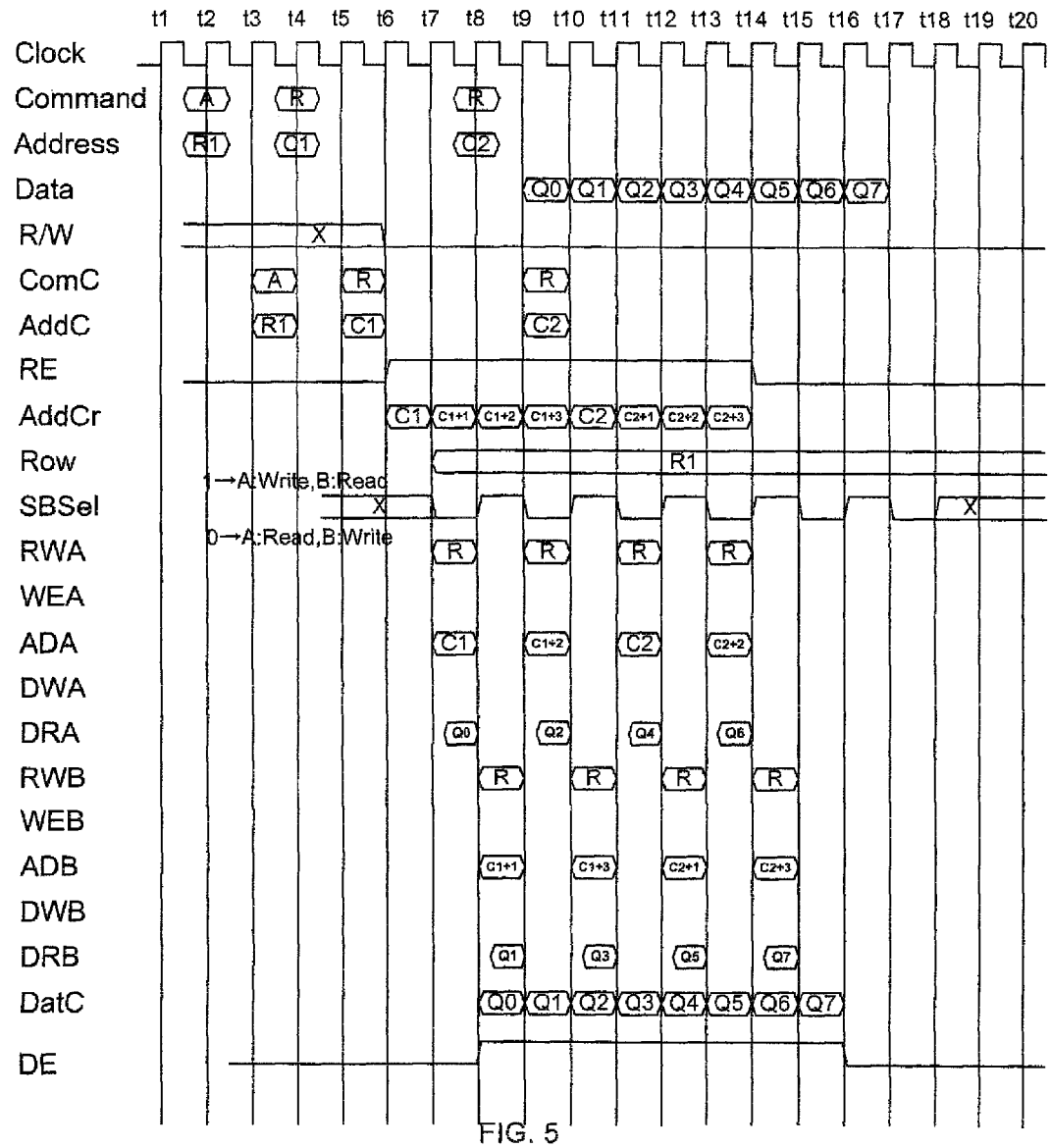
FIG. 5 is a timing chart obtained when burst reading is performed to the nonvolatile semiconductor memory device according to the first embodiment.

The configuration in FIG. 1 described above illustrates only j=1 in FIG. 2, and the timing charts in FIG. 4 and FIG. 5 illustrate a case in which j=1. Conversely, in the configuration in FIG. 2, the operations shown in the timing chart in FIG. 1 are executed for each memory unit.

A method of a write/read operation to the nonvolatile semiconductor memory device according to the embodiment and a method of manufacturing the apparatus will be briefly described below. These methods are the same as those in the following second and third embodiments, and a description thereof will not be made in the embodiments.

As an example, a case in which each sub-bank has a circuit configuration shown in FIG. 3 will be described below. In the following explanation in the embodiment, "write" is described in distinction from "erase". A case in which the variable resistive element R is in a low-resistance state is defined as a "write state", and a case in which the variable resistive element R is in a high-resistance state is defined as an "erase state".

Figure 15:
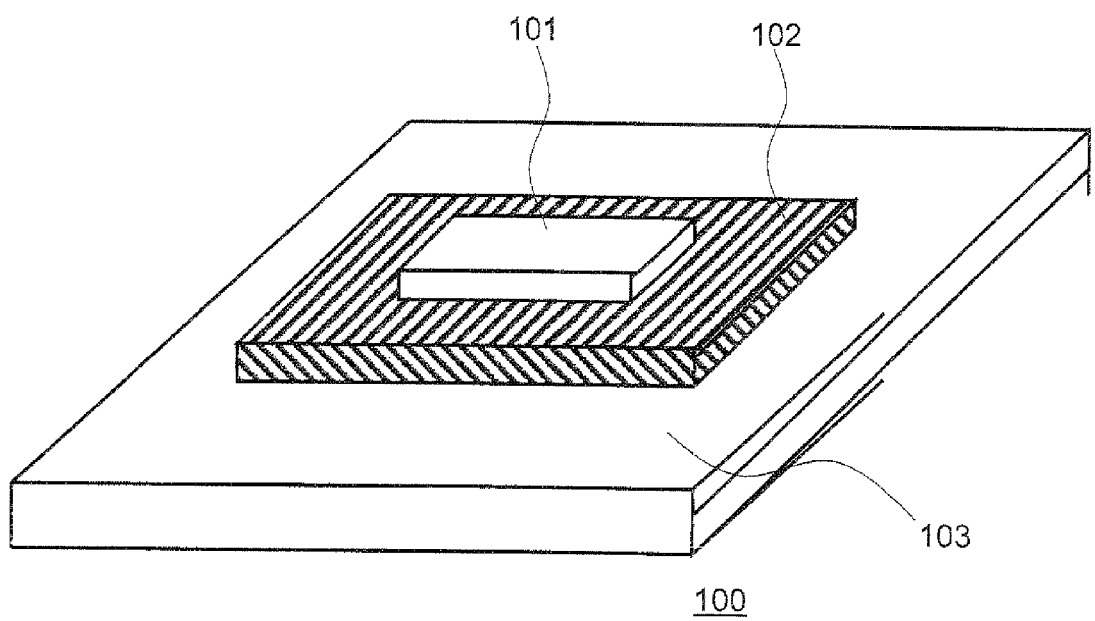
FIG. 15 is a schematic structural diagram of an RRAM.

Furthermore, the RRAM constituting each memory cell has a configuration as shown in FIG. 15 and has a characteristic in which transition to the low-resistance state occurs when a voltage is applied across both the terminals of the RRAM with a polarity from the lower electrode 103 to the upper electrode 101 and transition to the high-resistance state occurs when a voltage having a reverse polarity is applied. It is assumed that a bit line is connected to the upper electrode 101 and that a source line is connected to the lower electrode 103.

A write operation (reduce in resistance of a variable resistive element) to a memory cell will be described first. When a write target memory cell is designated, the row decoder 53 applies a voltage of +2 V to a word line (selected word line) connected to the memory cell (selected memory cell), and a voltage of 0 V is applied to word lines (non-selected word lines) except for the selected word line. A voltage of 0 V is applied to a source line S. Furthermore, the column decoders (51A and 51B) apply a voltage of +2 V to a bit line (selected bit line) connected to the selected memory cell and apply a voltage of 0 V to bit lines (non-selected bit lines) except for the selected bit line. At this time, in the write operation, since a positive voltage is applied to the upper electrode of the variable resistive element R constituting the selected memory cell (on the other hand, the lower electrode is grounded), transition of the variable resistive element R to the low-resistance state occurs to write data. On the other hand, since no voltage is applied to the variable resistive element R of the non-selected cell, data is not written (data does not vary).

The voltage applied to the selected word line is set to +2 V in the above description. However, this value is only an example, and may be actually equal to or more than a voltage (so-called threshold voltage of a transistor) enough to cause the selected transistor to conduct electricity. The voltage applied to the selected bit line is set to +2 V in the above description. However, this value is only an example, and may be actually equal to or more than a voltage (threshold voltage of a switching operation) enough to cause transition of the resistance state of the variable resistive element to occur by a potential difference from voltages applied to the source line.

In an erase operation (increase in resistance of a variable resistive element) of a memory cell, the polarity of a voltages applied across both the terminals of the variable resistive element in an erase target memory cell may be inverted with reference to the polarity in the write operation. More specifically, as in the write operation, in order to cause the selected transistor to conduct electricity, the row decoders (53) applies a voltage of 0 V to the selected bit line, applies a voltage of +2

V to the non-selected bit line, and applies a voltage of +2 V to the source line S. In this manner, since a positive voltage is applied to the lower electrode of the variable resistive element R constituting the selected memory cell (on the other hand, the upper electrode is grounded), transition of the variable resistive element R to the high-resistance state occurs to erase data. On the other hand, since no voltage is applied to the variable resistive element R of the non-selected cell, data is not erased (data does not vary).

A read operation of a memory cell will be described below. When a read target memory cell is designated, the row decoder 53 applies a voltage of +2 V to the selected word line connected to the selected memory cell, and a voltage of 0 V is applied to non-selected word lines except for the selected word line. A voltage of 0 V is applied to a source line S. Furthermore, the column decoders (51A and 51B) apply a voltage of +1 V to a bit line (selected bit line) connected to the selected memory cell and apply a voltage of 0 V to bit lines (non-selected bit lines) except for the selected bit line. In this manner, in a state in which the selected transistor connected to the selected memory cell is caused to conduct electricity, a voltage of 1 V for reading is applied across the bit line and the source line. Actually, due to the presence of a wiring resistance or an ON resistance of the selected transistor, voltage drop is caused by the resistances. For this reason, a voltage lower than 1 V (for example, about 0.7 V) is applied across both the terminals of the variable resistive element R in the selected memory cell.

In this state, a current (read current) flowing in the selected bit line is detected and amplified by the read circuit 43 to convert the current into a voltage signal. The voltage signal is output to the comparing unit 37 or the output control unit 33 as the signal DatC. When a variable resistive element of the selected memory cell serving as a read target is in a high-resistance state, a read current is small. In contrast to this, when the variable resistive element is in a low-resistance state, the read current is large. For this reason, the resistance state of the variable resistive element in the read target memory cell can be detected by determining the value of the signal DatC. That is, the following is recognized. When the signal DatC is small, the target memory cell is in a high-resistance state, i.e., an "erase state". In contrast to this, when the signal DatC is large, the target memory cell is in a low-resistance state, i.e., a "write state".

Even in the read operation, a voltage applied to the selected word line is set to +2 V in the above description. However, this value is only an example, and may be actually equal to or more than a voltage (so-called threshold voltage of a transistor) enough to cause the selected transistor to conduct electricity. The voltage applied to the selected bit line is set to +1 V in the above description. However, this value is only an example, and may be actually a voltage falling within a range (within the range in which a rewriting operation does not occur) in which the resistance state of the variable resistive element can be detected by a potential difference between the voltage and the voltage applied to the source line and in which the resistance state does not vary.

Figure 6:
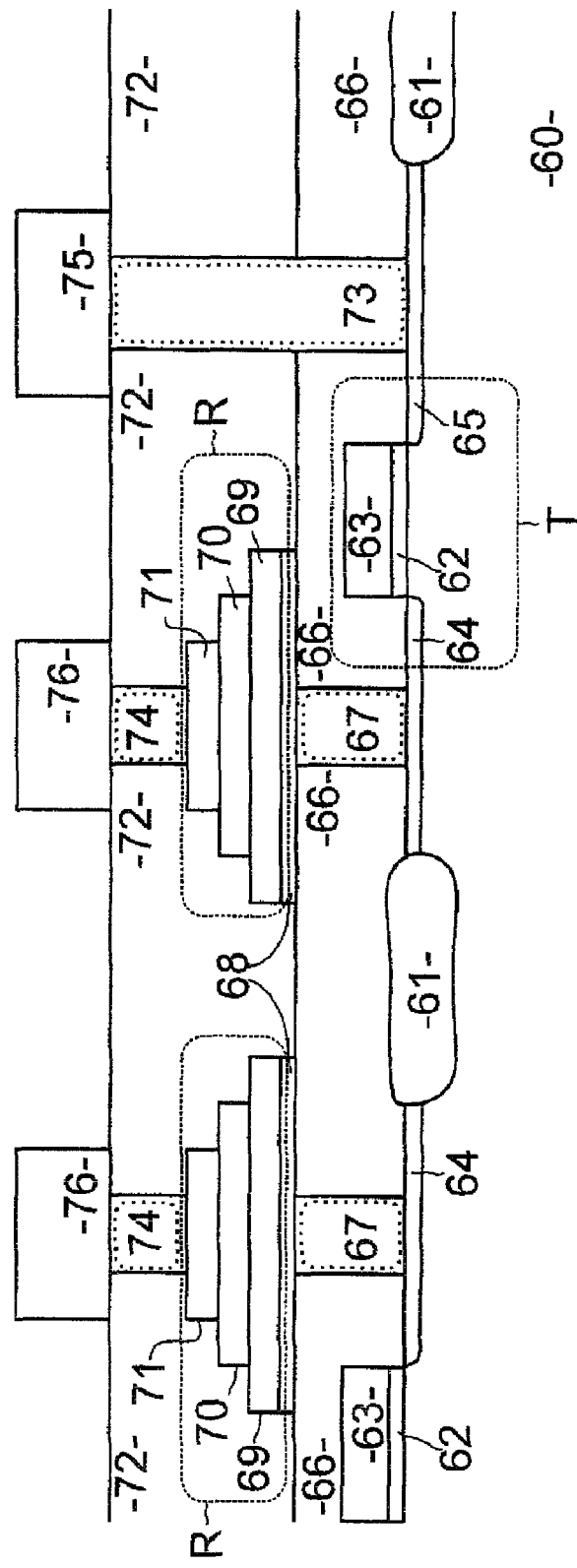
FIG. 6 is a schematic diagram showing a configuration of a memory cell.

A method of manufacturing a nonvolatile semiconductor memory device including a 1T1R type memory cell as shown in FIG. 3 will be briefly described below. FIG. 6 is a schematic sectional diagram showing a structure of the memory cell. FIG. 6 is a conceptual diagram, and a ratio of dimensions on the diagram are not always matched with an actual radio of dimensions.

A selecting transistor T is formed on a semiconductor substrate 60. More specifically, on the semiconductor substrate 60 on which an element isolation region 61 is formed, the selecting transistor T constituted by a gate insulating film 62, a gate electrode 63, and a drain diffusion region 64 and a source diffusion region 65 is formed. In this case, although not shown, peripheral circuits (memory control unit 30 or the like described above) except for the memory cell are formed together with the memory cell.

After an insulating interlayer 66 consisting of BPSG (Boron Phosphorous Silicate Glass) is formed, a contact hole 67 reaching a drain region 64 of the selecting transistor T is formed by a known photolithography method and a known dry-etching method. A contact plug obtained by burying only the contact hole 67 with a conductive metal material such as W is formed by a known method.

As an ohmic contact layer 68 to stably secure an electric contact between the conductive contact plug buried in the contact hole 67 and a lower electrode 69 that forms the variable resistive element R, a TiN/Ti film is formed to have a thickness of 100 nm/50 nm by a sputtering method. On the upper side of the an ohmic contact layer 68, a TiN film having a thickness of 200 nm is formed to form a lower electrode 69.

Furthermore, titanium oxide serving as a variable resistor film 70 is formed on the lower electrode (TiN film) 69 by a DC magnetron sputtering method or a CVD method to have thicknesses of 5 to 50 nm. As an upper electrode 71, a TiN film having a thickness of 100 nm is formed. Thereafter, the upper electrode 71, a variable resistor film 70, and a lower electrode 69 are sequentially processed by a known photolithography method and a dry etching method to complete a variable resistive element R.

The variable resistor film 70 is not limited to a titanium oxide film, and oxide of a transition metal element, such as cobalt oxide, nickel oxide, zinc oxide, or niobium oxide, can be used. After the transition metal is formed, an oxidizing process may be performed to form the variable resistor film 70.

The upper electrode and the lower electrode are formed by TiN (titanium nitride film). The electrode material is not limited to titanium nitride, and another metal material such as Ta, Pt, Ir, Os, Ru, Rh, Pd, Al, or W can be used.

In this manner, the variable resistive element R is formed, an insulating interlayer 72 is formed on the variable resistive element R to have thicknesses 50 to 60 nm, and a contact hole 74 connected to the variable resistive element R (upper electrode 71) and a contact hole 73 connected to the source diffusion region 65 of the selecting transistor T are opened.

As a wiring material, a TiN/Al—Si/TiN/Ti film is formed and processed by a known photolithography method and a known dry-etching method to form a wiring layer 75 and a wiring layer 76.

An insulating interlayer 77 is formed, and contact holes (not shown) reaching the wiring layer 75 and the wiring layer 76 are formed. Thereafter, a TiN/Al—Si/TiN/Ti film is formed and processed by a known photolithography method and a known dry-etching method to form a wiring layer 78 (processing pattern is not shown). Finally, as a surface protecting film 79, an SiN film is formed by a plasma CVD method, and a semiconductor memory device having the variable resistive element R and the selecting transistor T in the memory cell is completed.

In the above manufacturing procedure described above, the contact holes, wiring processing of the peripheral circuits, and the like are omitted. However, the contact holes and the wiring layers may be formed together with each other in formation of the parts in the memory cell.

In the above description, a manufacturing method and a driving method in the memory cell having a 1T1R configuration are explained. However, the type of the configuration of the memory cell is not limited to the 1T1R type. For example, as another example, a memory cell having a memory cell configuration in which a bit line and a word line are directly connected to the upper electrode or the lower electrode, respectively, to directly read data of a variable resistor at a cross point between both the electrodes, i.e., a cross-point type (1R type) memory cell can also be used. Furthermore, in order to reduce a parasitic current in the cross-point configuration, a memory cell having a 1D1R configuration in which the variable resistive element R and a diode are connected in series with each other may be used. The diode generally has a structure in which the diode is connected in series with the variable resistor across the upper electrode or the lower electrode. However, the diode may have a structure in which the diode is arranged between the variable resistor and the upper electrode or between the variable resistor and the lower electrode. As the diode, a material having a PN diode characteristic or a Schottky diode characteristic or a varistor such as ZnO or $Bi_2O_3$ or the like is used.

Second Embodiment

The second embodiment of the present invention (to be arbitrarily referred to as the "embodiment" hereinafter) will be described below with reference to FIGS. 7 to 8.

The embodiment is different from the first embodiment except for only write and read procedures, and configuration elements of the embodiment is the same as those in the first embodiment (FIG. 1). Only the procedures will be described below with reference to the timing chart, and an explanation about the constituent elements are omitted. Even in the embodiment, an explanation will be made on the assumption of 1-bit data. However, as described with reference to FIG. 2, when it is regarded that a plurality of memory units are connected to the memory control unit 30, multi-bit data can be handled in the same manner as described above.

The embodiment is different from the first embodiment in that a prefetch technique is used in write and read processes. The prefetch technique is a technique that is used in a high-speed memory such as a DDR SDRAM (Double-Data-Rate Synchronous Dynamic Random Access Memory) upon request for increasing a read/write speed in the recent years. In a read process, data parallel read from the plurality of memory cells are temporarily taken into a buffer and output to the outside of the memory such that the data are rearranged in one column to achieve a high-speed process. In contrast to this, in the write process, a data string input to the memory is temporarily taken in the buffer and written in the plurality of memory cells in parallel to achieve a high-speed process.

Figure 7:
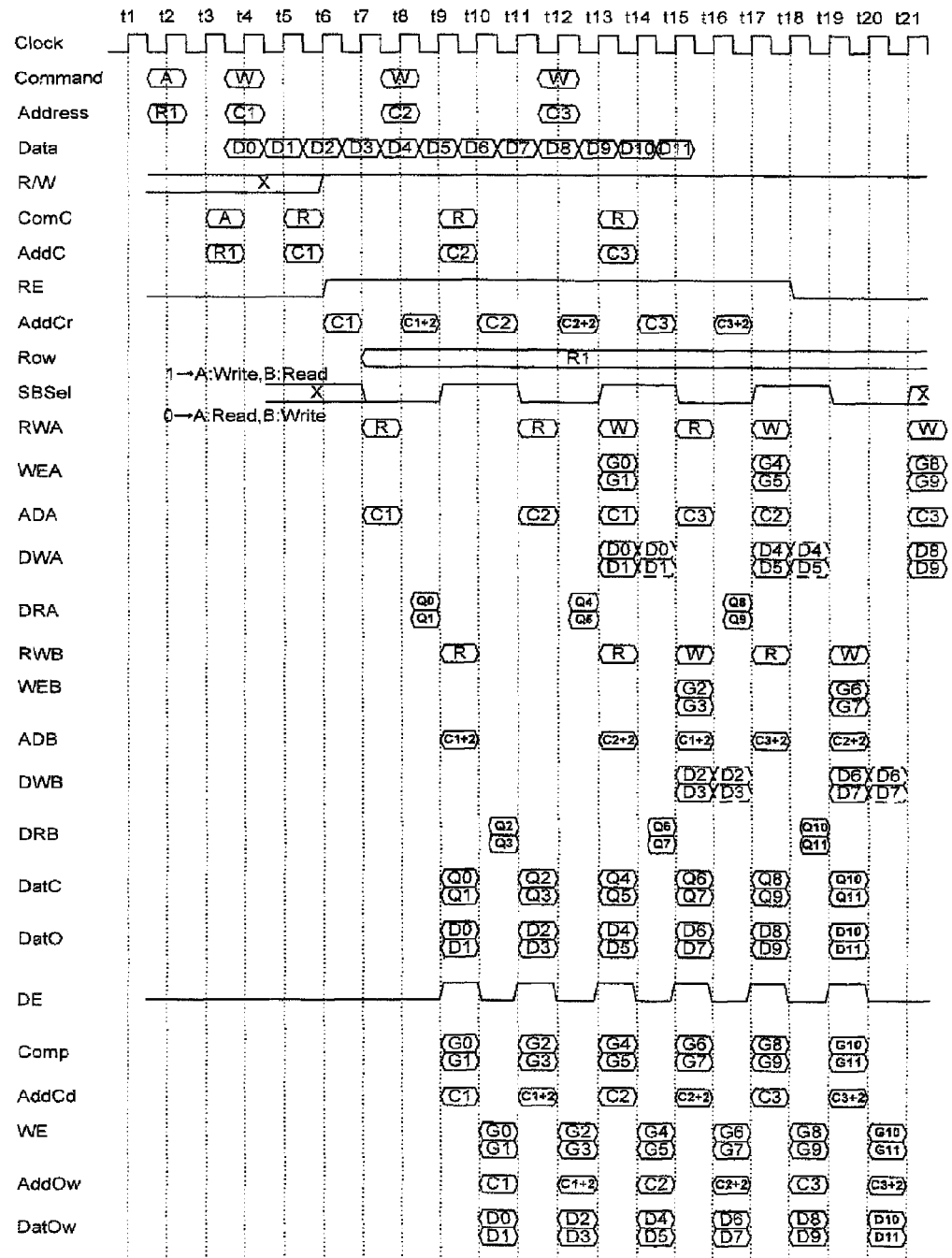
FIG. 7 is a timing chart obtained when burst writing is performed to the nonvolatile semiconductor memory device according to a second embodiment.
Figure 8:
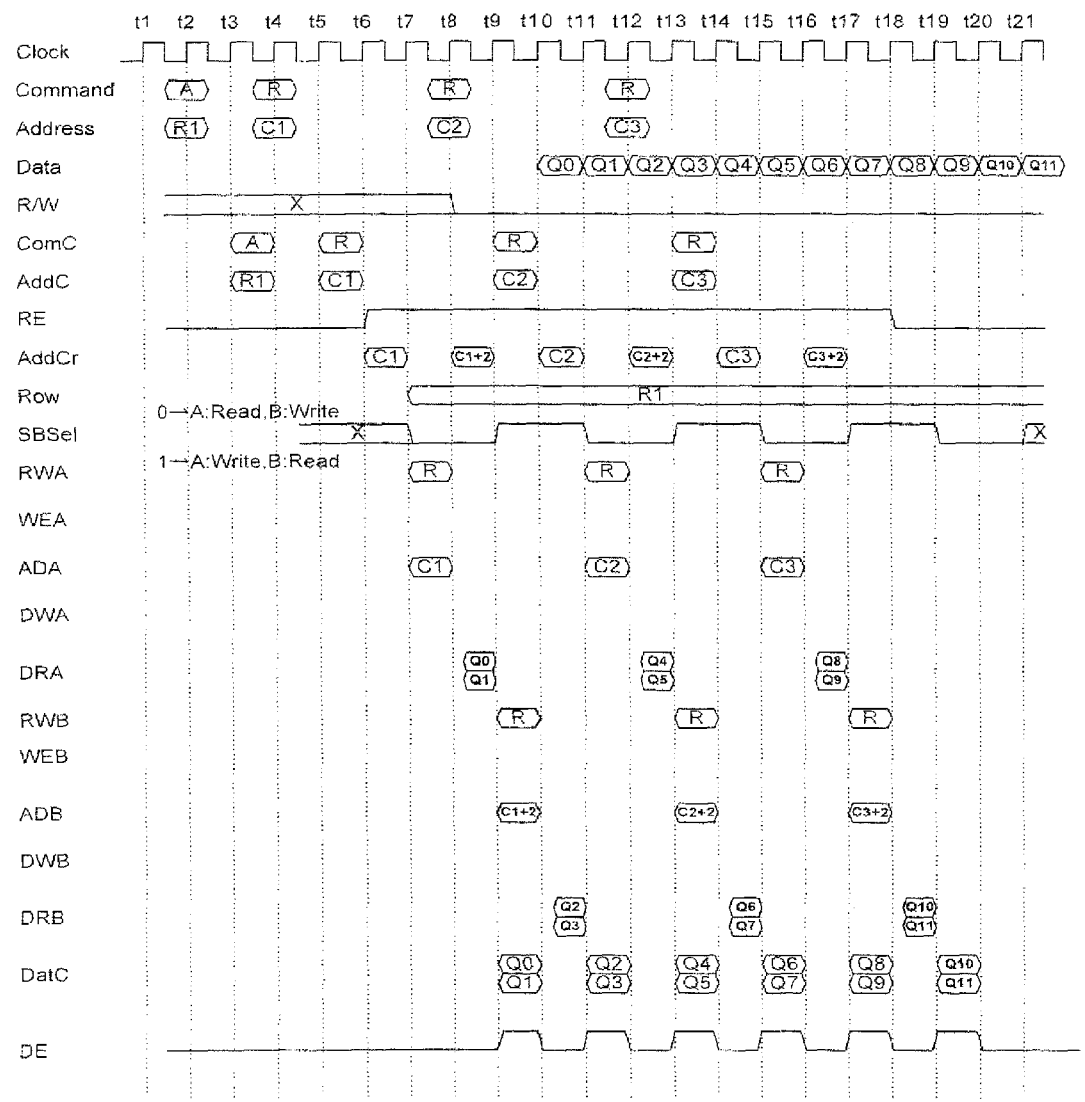
FIG. 8 is a timing chart obtained when burst reading is performed to the nonvolatile semiconductor memory device according to the second embodiment.

FIG. 7 is a timing chart showing a procedure of a burst write process to the nonvolatile semiconductor memory device (memory) according to the embodiment. In FIG. 7, as in FIG. 4, it is assumed that a burst length is 4 in a clock synchronous type memory. On the other hand, in FIG. 7, unlike in FIG. 4, 2-bit prefetch is applied.

When the row address designation command "A" and the row address "R1" are given to the memory control unit 30 (time t2), the instruction interpreting unit 31 that receives the command "A" transmits the command "A" to the row address buffer 35 as the signal ComC at an appropriate timing (for example, in time t3 to time t4). The row address "R1" is temporarily taken in the buffer 32 and then output to the row address buffer 35 and the read control unit 36 as the signal AddC in synchronization with the output of the command "A" as the signal ComC. The row address buffer 35 holds the row address "R1" input as the signal AddC in the buffer therein by using the command "A" input as the signal ComC as a trigger.

Subsequently, when the write command "W" and a designation address "C1" are given to the memory control unit 30 (time t4), the instruction interpreting unit 31 that receives the command "W" outputs the command "R" as the signal ComC to the read control unit 36 and the read/write switching control unit 41 at an appropriate timing (for example, from t5 to t6). The address "C1" is temporarily held in the buffer 32 and then output as the signal AddC to the read control unit 36 in synchronization with outputting of the command "R" as the signal ComC. The read control unit 36 holds the address "C1" input as the signal AddC in the buffer therein by using the command "R" input as the signal ComC as a trigger. The instruction interpreting unit 31 sets the signal R/W to a "High" level at an appropriate timing.

Each time the read control unit 36 receives the command "R", the read control unit 36 outputs serial address values corresponding to a burst length (in this case, corresponding to four times) to the sub-bank replacing unit 42 as the signal AddCr. In the embodiment, since 2-bit prefetch is employed, addresses are designated for every two bits to output the signal signal AddCr. More specifically, with respect to an "R" command received in time t5 to time t6 described above, an address "C1" is output in time t6 to time t7, and an address "C1+2" is output in time t8 to time t9. While the addresses are output (in time t6 to time t7 and time t8 to time t9) and in one cycle (in time t7 to time t8 and time t9 to time t10) immediately thereafter, the read control unit 36 outputs a "High" level signal RE to the sub-bank replacing unit 42. Since the embodiment is on the assumption that data reading from a sub-bank requires two cycles (2-bit prefetch is applied), access itself to the sub-bank needs to be performed in a 2-cycle periods, and switching of reading/writing also needs to be performed in a 2-cycle period. For this reason, as a signal RE for switching control of reading/writing, a signal switched in a 2-cycle period is used. By the way, when 4-bit prefetch is applied, a 4-cycle period may be used.

As in the first embodiment, the memory control unit 30 starts inputting of write target data at the same time in synchronism with inputting of the "W" command (time t4). Since the burst length is 4 in the example described in the embodiment, four write target data (D0, D1, D2, and D3) are input for one "W" command (time t4 to time t7). The input write target data are temporarily held in the buffer 34 after time t9 until the comparing unit 37 compares the write target data with the written data read from the sub-bank 52A or 52B.

In the timing chart in FIG. 7, as in FIG. 4, since access to the sub-bank is started at time t7, at this time, the row address buffer 35 supplies a signal Row representing the row address "R1" to the row decoder 53 to activate the row address line. As a matter of course, the row address line may be activated at a timing earlier than the time t7.

After time t7, based on the signal RE (corresponding to a read trigger signal) given from the read control unit 36 and the signal AddCr (corresponding to a read designation address signal), the sub-bank replacing unit 42 starts a read process for the sub-banks 52A and 52B through the column decoders 51A and 51B. When the signal SBSel input from the read/write switching control unit 41 is "Low", the sub-bank replacing unit 42 instructs the column decoder 51A to perform reading. When the signal SBSel is "High", the sub-bank replacing unit 42 instructs the column decoder 51B to perform reading. More specifically, the sub-bank replacing unit 42 replaces a read target sub-bank between the sub-banks 52A and 52B by the signal SBSel. At this time, as described above, in the embodiment, since access to a sub-bank needs to be performed in a 2-cycle period, a timing for switching read target sub-banks by the signal SBSel is performed in a 2-cycle period.

In the embodiment, serial two addresses are allocated in the same sub-bank, addresses are allocated to different sub-banks every two addresses. More specifically, addresses C1 and C1+1 are present in one sub-bank, whereas addresses C1+2 and C1+3 are present in the other sub-bank. In this case, the following explanation will be made on the assumption that addresses C1 and C1+1 are present in sub-bank 52A and addresses C1+2 and C1+3 are present in the sub-bank 52B.

The sub-bank replacing unit 42 gives a read instruction to the column decoder 51A or 51B while the signal RE is at "High". In time t7 to time t8, since the signal SBSel is at "Low", the sub-bank replacing unit 42 instructs the column decoder 51A to read the written data in a memory cell corresponding to an address C1 designated by the signal AddCr and an address (i.e., address C1+1) subsequent to the address C1. At this time, a row address (row address R1 designated by the signal Row) designated by the row decoder 53 is active. Within the period from time t7 to time t9, the column decoder 51A transmits the written data in the memory cell corresponding to the addresses C1 and C1+1 from the sub-bank 52A to the sub-bank replacing unit 42 as the signal DRA (data Q0 and Q1).

In the first embodiment, when the read command "R" and the designation address "C1" are given in time t7 to time t8, the written data in the memory cell corresponding to the address C1 is read. In contrast to this, in the embodiment, a time from time t7 to time t9 is required until the reading of the written data is perfectly completed. On the other hand, the read target addresses are the two addresses "C1" and "C1+1". More specifically, a time for two cycles is required from when the read command is input to the column decoder 51A to when the read data DRA is output, but data of two addresses is read. As a result, as in the first embodiment, data of one address is obtained per cycle.

In time t9 to time t10, since the signal SBSel is at "High", the sub-bank replacing unit 42 instructs the column decoder 51B to read the written data in memory cells each corresponding to an address C1+2 designated by the signal AddCr and an address (i.e., address C1+3) subsequent to the address C1+2. At this time, a row address (row address R1 designated by the signal Row) designated by the row decoder 53 is active. Within the period from time t9 to time t11, the column decoder 51B transmits the written data in the memory cells each corresponding to the addresses C1+2 and C1+3 from the sub-bank 52B to the sub-bank replacing unit 42 as the signal DRB (data Q2 and Q3).

In time t9 to time t10, the read data (Q0 to Q1) merged by the sub-bank replacing unit 42 is amplified by the read circuit 43 and then output to the comparing unit 37 as the signal DatC. Similarly, in time t11 to time t12, the read data (Q2 to Q3) merged by the sub-bank replacing unit 42 is amplified by the read circuit 43 and then output to the comparing unit 37 as the signal DatC. It is shown by an active (High) signal DE that data is output from the signal DatC.

When the signal R/W given from the instruction interpreting unit 31 is at "High", the comparing unit 37 performs a comparing operation when the signal DE is active. At this time, the signal DatC is compared with the write target data DatO output from the buffer 34 by using the signal DE as a trigger. More specifically, the comparing unit 37 compares the write target data D0 to D1 with the data Q0 to Q1 read from the sub-bank 52A in time t9 to time t10, and outputs a result thereof to the write control unit 39 as data G0 to G1 (signal Comp). Similarly, the comparing unit 37 compares the write target data D2 to D3 with the data Q2 to Q3 read from the sub-bank 52B in time t11 to time t12, and outputs a result thereof to the write control unit 39 as data G2 to G3 (signal Comp).

The write control unit 39 performs data write control to the sub-bank replacing unit 42 based on the data of the signal Comp input from the comparing unit 37. More specifically, the write control unit 39 outputs an instruction to write a bit designated from the comparing unit 37 among the write target data held in the buffer 34 to an address held in the buffer 38. At this time, the write control unit 39 outputs the signal AddOw, the signal WE, and the signal DatOw designating an address, a write bit, and write target data, respectively, to the sub-bank replacing unit 42 (in time t10 to time t11 and time t12 to time t13). The signal WE representing a write bit is generated based on the signal Comp given from the comparing unit 37, and only a bit at which a comparison result between the written data and the write target data represents mismatching is designated as a write bit.

When the sub-bank replacing unit 42 receives the data write instruction from the write control unit 39, the sub-bank replacing unit 42 instructs the column decoders 51A and 51B to write data (in time t13 to time t17). At this time, while a read process is performed to one column decoder, a write instruction is given to another column decoder. More specifically, for example, in time t13 to t15, a write instruction is given to the column decoder 51A. In time t15 to time t17, a write instruction is given to the column decoder 51B. In this manner, in time t13 to time t15 in which a read instruction is given to the column decoder 51B, a write instruction is given to the column decoder 51A. In time t15 to time t17 in which a read instruction is given to the column decoder 51A, a write instruction is given to the column decoder 51B.

Since a designation of the written bit by the signal WE is reflected on the signal WEA output to the column decoder 51A and the signal WEB output to the column decoder 51B, only a bit at which the comparison result obtained by the comparing unit 37 represents mismatching is a designated signal. More specifically, in each of the sub-banks 52A and 52B, only a bit at which the write target data has a value different from that of the written data is written.

In FIG. 7, the signals DWA and DWB are partially indicated by broken lines. This shows that, since the embodiment employs a method in which two cycles are required to write data in each memory cell, the write process is performed for two consecutive cycles, and the write process is completed in the second cycle.

In the embodiment, since access to the sub-bank is performed by repeating two read cycles and two write cycles, a timing adjusting time of two cycles is required until the sub-bank replacing unit 42 outputs write instructions to the column decoders 51A and 51B after the write control unit 39 outputs a write instruction (see timings of the signals RWA and RWB in FIG. 7). The timing adjustment and buffering required therefor may be performed in the sub-bank replacing unit 42.

In this manner, write target data (D0 to D3) corresponding to the "W" command input at time t4 are completely written in the sub-banks in time t13 to time t17 (or the same written data is directly used). The same process as described above is also performed to the write target data (D4 to D7) corresponding to the "W" command input at time t8. At this time, referring to FIG. 7, subsequent to timing in time t15 to time t17 in which writing of the data D2 and D3 is completed, data D4 and D5 are written in the sub-bank 51A in time t17 to time t19. More specifically, even though the write commands "W" are continuously input to the memory control unit 30 (at burst-length intervals), a time lag does not occur. In this manner, a writing rate does not become low. Even though the write commands "W" are continuously input as described above (at burst-length intervals), time required for writing can be assured, and a write error does not occur.

A procedure of a concrete read operation will be described below with reference to the timing chart in FIG. 8. As in FIG. 7, in FIG. 8, a case in which a burst length is 4 is exemplified. The read operation may be considered such that, in the write operation procedure shown in FIG. 7, the comparing process by the comparing unit 37, the write instruction by the write control unit 39 and the sub-bank replacing unit 42, and the write process by both the column decoders 51A and 51B are not performed.

When the row address designation command "A" and the row address "R1" are given to the memory control unit 30 (time t2), as in the write operation, the instruction interpreting unit 31 that receives the command "A" transmits the command "A" to the row address buffer 35 as the signal ComC at an appropriate timing (for example, in time t3 to t4). The row address "R1" is temporarily taken in the buffer 32 and then output to the row address buffer 35 and the read control unit 36 as the signal AddC in synchronization with the output of the command "A" as the signal ComC. The row address buffer 35 holds the row address "R1" input as the signal AddC in the buffer therein by using the command "A" input as the signal ComC as a trigger.

Subsequently, when the read command "R" and a designation address "C1" are given to the memory control unit 30 (time t4), the instruction interpreting unit 31 that receives the command "R" outputs the command "R" as the signal ComC to the read control unit 36 and the read/write switching control unit 41 at an appropriate timing (for example, from t5 to t6). The address "C1" is temporarily held in the buffer 32 and then output as the signal AddC to the read control unit 36 in synchronization with outputting of the command "R" as the signal ComC. The read control unit 36 holds the address "C1" input as the signal AddC in the buffer therein by using the command "R" input as the signal ComC as a trigger. However, the instruction interpreting unit 31 outputs a signal R/W at "Low" level unlike in a write operation because the input command is the read command "R". The signal R/W may be kept at "Low" level until the write command "W" is input to, for example, the instruction interpreting unit 31.

As in the write operation, each time the read control unit 36 receives the command "R", the read control unit 36 outputs serial address values corresponding to a burst length to the sub-bank replacing unit 42 as the signal AddCr. However, in the embodiment, since 2-bit prefetch is employed, addresses are designated for every two bits to output the signal AddCr. More specifically, with respect to an "R" command received in time t5 to time t6 described above, an address "C1" is output in time t6 to time t7, and an address "C1+2" is output in time t8 to time t9. While the addresses are output (in time t6 to time t7 and time t8 to time t9) and in one cycle (time t7 to time t8 and time t9 to time t10) immediately thereafter, the read control unit 36 outputs a "High" level signal to the sub-bank replacing unit 42.

After time t7, as in the write process, based on the signal RE (corresponding to a read trigger signal) given from the read control unit 36 and the signal AddCr (corresponding to a read designation address signal), a read process to the sub-banks 52A and 52B is started through the sub-bank replacing unit 42 and the column decoders 51A and 51B. The sub-bank replacing unit 42 distributes the read target sub-banks to the sub-banks 52A and 52B by the value (High/Low) of the signal SBSel input from the read/write switching control unit 41. In this manner, read processes from the sub-banks 52A and 52B are alternately performed. The read data (Q0 to Q1) is given to the read circuit 43 through the sub-bank replacing unit 42, subjected to an amplifying process here, and transmitted to the output control unit 33 as the signal DatC (time t9 to time t12). It is shown by an active (High) signal DE that data is output from the signal DatC. The output control unit 33 recognizes that the input signal R/W is at "Low" level and transmits the input signal DatC to the memory bus 21 when the signal DE is active.

In the embodiment, two data (for example Q0 and Q1) are transmitted from the read circuit 43 to the output control unit 33 as the signal DatC. For this reason, the two data may be output as the signal DatC by using a 2-cycle time or may be sequentially read one by one for every cycle (FIG. 8 shows the latter). In the latter, data Q0 is output as the signal DatC in, for example, time t9 to time t10, and the data Q0 can be output as the signal DatC in time t10 to t11. In this case, the output control unit 33 can buffer data represented by the signal DatC for 1-cycle time.

In this manner, data (Q1 to Q3) of the memory cells corresponding to the addresses C1 to C1+3 are read in times t10 to time t14.

Subsequent to time t4, also when the read command "R" and read row address "C2" are input at time t8, read instructions of the memory cells related to addresses C2 to C2+3 in the sub-banks are output in time t11 to time t15. In this manner, data at the address positions are read from the data bus of the memory control in time t14 to time t18. More specifically, even though the read commands "R" are continuously input to the memory control unit 30 (at burst-length intervals), a time lag does not occur in reading. In this manner, a reading rate does not become low. Similarly, when the write command "W" is input after the read command "R" is input, or in the opposite case, a time lag does not occur.

In the embodiment, operation contents of a memory that employs 2-bit prefetch are described above. However, in a memory that employs multi-bit prefetch having two or more bits, writing/reading can be executed in the similar manner. In the embodiment as in the first embodiment, when the write command "W" is given, the written data is read from the write target memory cell before a write process is actually performed to the memory cell to compare the written data with the write target data. Only when a comparison result represents mismatching, a write process of the write target data is performed to the memory cell. Therefore, in comparison with a conventional write process, the number of times of a write process which is performed by applying a write voltage to the same memory cell decreases. In this manner, the life of each of the memory cells can be prolonged.

Third Embodiment

A third embodiment (to be arbitrarily referred to as the embodiment hereinafter) will be described below with reference to FIGS. 9 to 14.

The embodiment includes one sub-bank (memory cell array) in comparison with the first and second embodiment. More specifically, unlike in the first and second embodiments, a process of executing writing and reading between a plurality of sub-banks in parallel to each other cannot be performed.

More specifically, the embodiment cannot employ the configuration in which the written data is read, and when the comparison result between the written data and the write target data represents mismatching, while the write target data is written in a target memory cell, the written data is read from another memory cell, and the written data is compared with the write target data. For this reason, even though the write target data are serially input, a comparing process between the next write target data and the written data cannot be performed until one write process is completed. More specifically, in the embodiment, since a data read/write process need to be executed to each of the addresses, a burst memory access is meaningless. Therefore, the following explanation will be made on the assumption that memory access is not a burst memory access.

Figure 9:
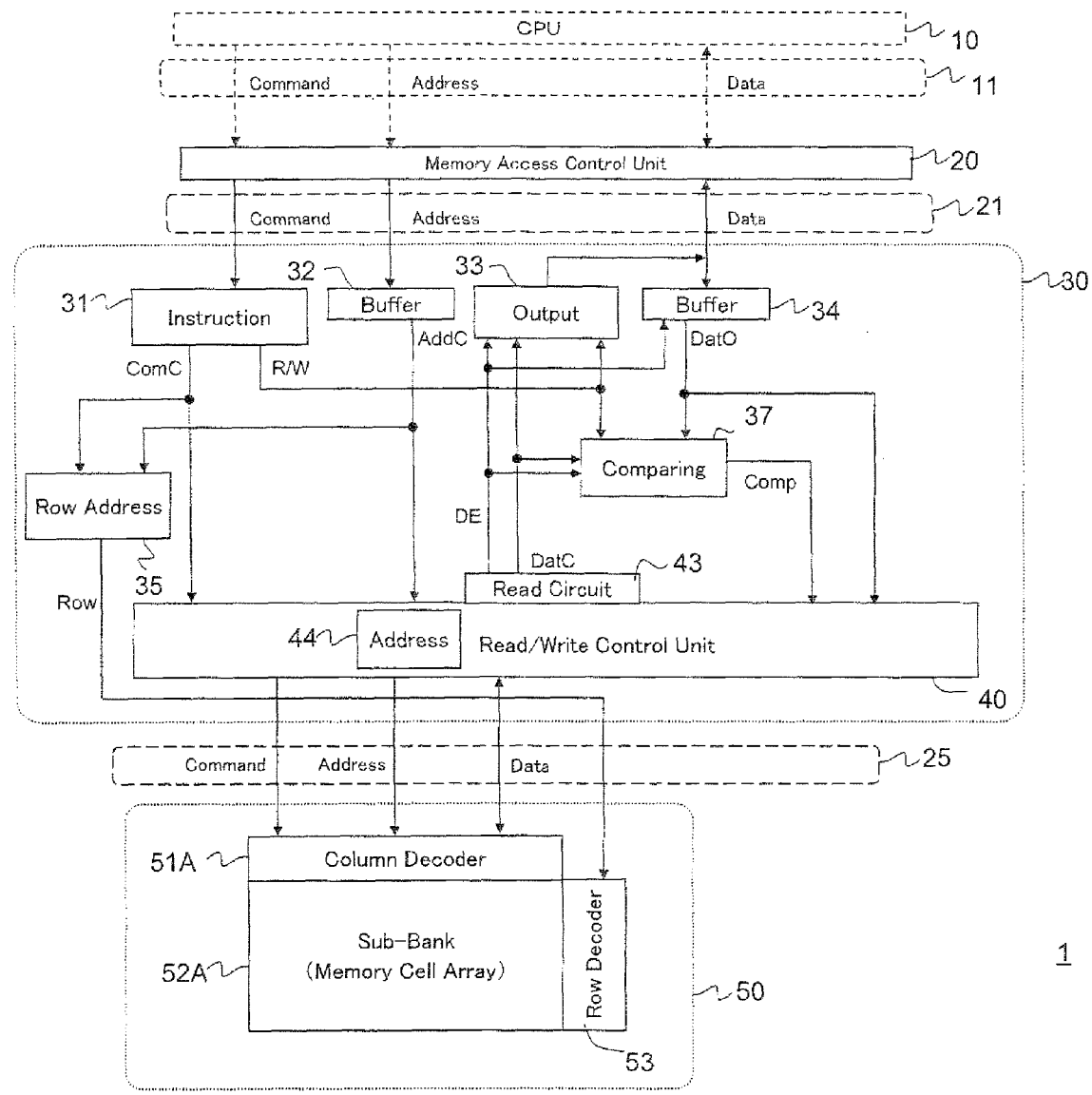
FIG. 9 is a block diagram showing a conceptual structure of a nonvolatile semiconductor memory device according to a third embodiment.

FIG. 9 is a block diagram showing a conceptual structure of a nonvolatile semiconductor memory device according to the embodiment and does not include the sub-bank 52B and the column decoder 51B in comparison with the block diagram shown in FIG. 1. More specifically, since a single sub-bank (memory array) 52A is arranged, control executed while reading and writing are switched is not necessary. For this reason, the read/write switching control unit 41 in FIG. 1 is not arranged. Since timings of reading and writing need not be controlled, the read control unit 36 and the write control unit 39 are not necessary. Furthermore, since an operation of replacing a plurality of sub-banks is not performed, as a matter of course, the sub-bank replacing unit 42 is not arranged.

Since burst reading or burst writing is not performed in the above configuration, based on one input address, serial addresses corresponding to a burst length need not be arithmetically operated and developed. For this reason, the read control unit 36 and the buffer 38 are not necessary.

For this reason, as shown in FIG. 9, the memory control unit 30 of the nonvolatile semiconductor memory device according to the embodiment includes the instruction interpreting unit 31, the buffer 32, the output control unit 33, the buffer 34, the row address buffer 35, the comparing unit 37, the read/write control unit 40, and the read circuit 43. The read/write control unit 40 includes an address buffer 44 therein.

Figure 10:
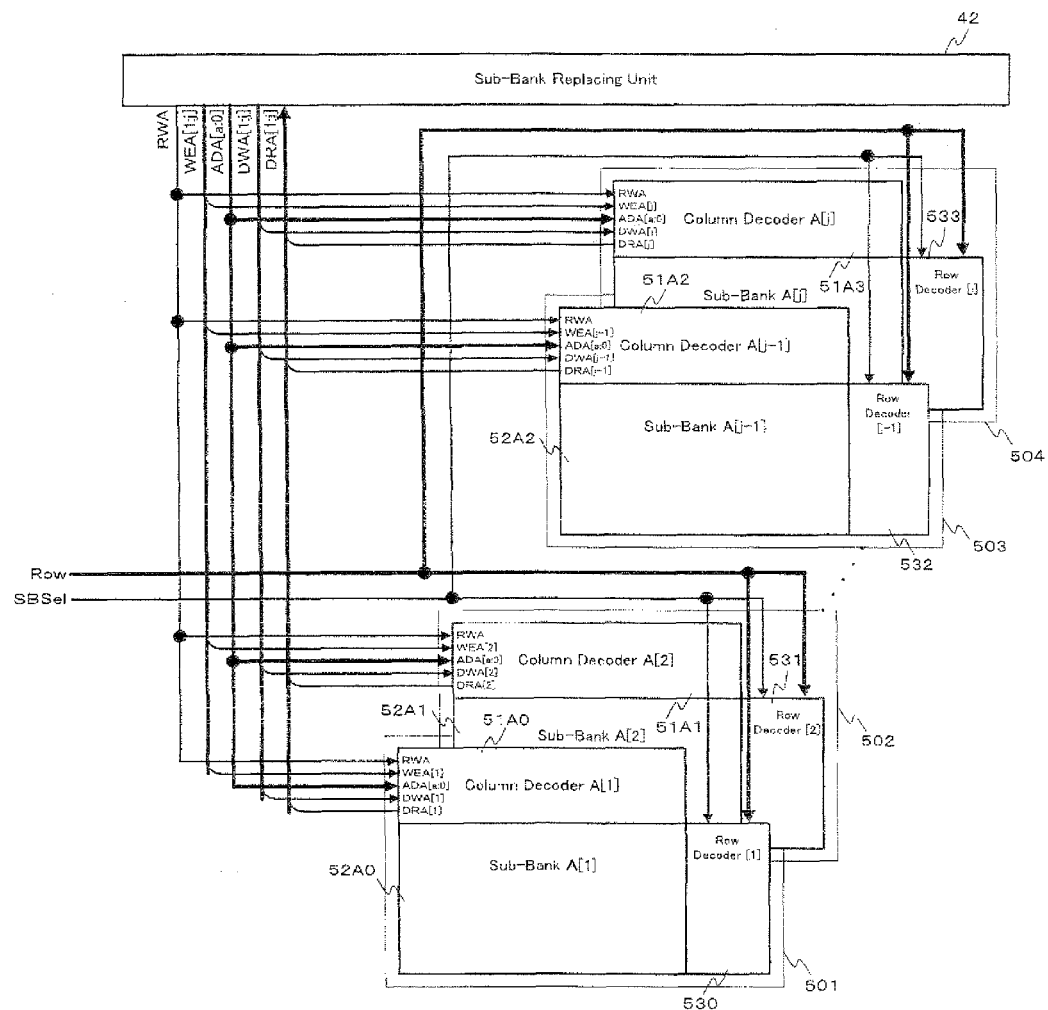
FIG. 10 is a block diagram showing another conceptual structure of a nonvolatile semiconductor memory device according to the third embodiment.

Even in the embodiment, as in the first embodiment, it is assumed that the decoder unit (row decoder 53 and column decoder 51A) and sub-bank 52A in FIG. 9, for descriptive convenience, have a configuration in which 1-bit data is set for one address. When multi-bit data is to be handled, a configuration as shown in FIG. 10 is employed. In other words, the configuration in FIG. 9 is obtained by illustrating the plurality of memory units and the plurality of decoder units shown in FIG. 10 as one unit. Since FIG. 10 shows a configuration obtained by removing the sub-bank B and the column decoder B from the configuration in FIG. 2 described in the first embodiment, an explanation of a connection relationship or the like of the constituent elements is not made to avoid a repetitive explanation.

A write operation in the embodiment will be described below with reference to the timing chart in FIG. 11.

When a CPU bus command (write) "CW", a CPU bus address "CA1", and CPU bus data (write target data) "CD1" are transmitted from the CPU 10 to the memory access control unit 20, the memory access control unit 20 converts the formats of the command, the address, and the data into formats suitable for the memory control unit 30 and transmits the command, the address, and the data to the memory control unit 30 through the memory bus 21. More specifically, the CPU bus address "CA1" is divided into an upper part "AA1 (row address)" and a lower part "WA1 (column address)", a row address "AA1" is output to the address of the memory bus 21 when an "AC (row address designation command)" is output to the command of the memory bus 21, and a column address "WA1" is output to the address of the memory bus 21 when a "WC (write command)" is output to the command of the memory bus 21. As a result, the "AC" and the "WC" output to the command of the memory bus 21 are given to the instruction interpreting unit 31, and the "AA1" and the "WA1" output to the address of the memory bus 21 are given to the buffer 32. When the "WC" is output to the command of the memory bus 21, "WD1" is output to the data of the memory bus 21 and supplied to the buffer 34. The "WD1" has the same value as that of the "CD1".

When the instruction interpreting unit 31 recognizes the input command as a row address designation command "AC", the instruction interpreting unit 31 transmits the command to the row address buffer 35 as the signal ComC. In synchronization with this, the row address "AA1" is transmitted from the buffer 32 to the row address buffer 35 as the signal AddC. For this reason, the row address buffer 35 transmits the row address "AA1" to the row decoder 53 as the signal Row by using a row address designation command "AC" as a trigger. The row decoder 53 activates the row address of the sub-bank 52A, which is designated by the signal Row.

When the instruction interpreting unit 31 recognizes the input command as the write command "WC", the instruction interpreting unit 31 transmits the command to the read/write control unit 40 as the signal ComC. In synchronization with this, since the column address "WA1" is transmitted from the buffer 32 to the read/write control unit 40 as the signal AddC, the read/write control unit 40 stores the "WA1" in the address buffer 44 therein by using the "WC" transmitted as the signal ComC as a trigger. When the instruction interpreting unit 31 receives the write command "WC", as in the first embodiment, the instruction interpreting unit 31 makes the signal R/W active (High state) to give the signal R/W to the output control unit 33 and the comparing unit 37.

When the read/write control unit 40 receives an instruction of a write process by the write command "WC" as described above, after the write address "WA1" is written in the address buffer 44, a read command "RC" and a read address are output to the column decoder 51A through a memory bus 25. At this time, as a read address value, the write address "WA1" given as the signal AddC from the buffer 32 and stored in the address buffer 44 is used.

When the column decoder 51A receives the read command "RC" and the read address "WA1", a predetermined voltage is applied to a bit line such that a read voltage is applied across both the terminals of a memory cell (selected memory cell) corresponding to the address. When the row address "AA1" is given to a row decoder as the signal Row from the row address buffer 35, a predetermined voltage is applied to a word line and a source line, and a selected memory cell is activated. A current flowing in a voltage line connected to the selected memory cell is read by the read circuit 43 through the read/write control unit 40. In this manner, written data RD1 stored in the selected memory cell is read.

The read circuit 43 outputs the written data RD1 to the comparing unit 37 as the signal DatC. The signal DE representing an output timing of the data RD1 is to the comparing unit 37. Since the signal R/W is active (High state), when it is detected by the signal DE that the read data RD1 is output, the comparing unit 37 compares the read data RD1 with write target data WD1 given as the signal DatO from the buffer 34. When the comparison result Comp (corresponding to Cmp1 in FIG. 11) represents mismatching, the read/write control unit 40 is instructed to execute a write process, and the read/write control unit 40 outputs a write instruction of write target data WD1 for the memory cell. On the other hand, when the comparison result Cmp1 represents matching, nothing is not done.

More specifically, when the read/write control unit 40 is instructed to execute the write process, the read/write control unit 40 outputs a write command WC1, write address, and write target data to the column decoder 51A through the memory bus 25. As a write address, the address "WA1" given as the signal AddC from the buffer 32 and stored in the address buffer 44 is used, and data WD1 given as the signal DatO from the buffer 34 is used as the write target data. The buffer 34 is an FIFO buffer that is designed to delay input write target data by a predetermined period of time and then output the write target data. In the embodiment, as shown in FIG. 11, since a time interval from when data is input to the buffer 34 to when comparison is performed in the comparing unit 37 is constant, the data needs only be delayed by using the FIFO. When the column decoder 51A receives the write command, the write address, and the write target data, the column decoder 51A applies a predetermined voltage to a bit line such that a write voltage to write the write target data is applied across both the terminals of a memory cell (selected memory cell) corresponding to the address. As in the read process, when the "AA1" is given to a row decoder as the signal Row from the row address buffer 35, a predetermined voltage is applied to a word line and a source line, and a selected memory cell is activated. In this manner, a write process is executed to the selected memory cell.

When a predetermined time has elapsed after a CPU bus command is issued, the nonvolatile semiconductor memory device according to the embodiment can accept a new command input. The predetermined time is a shortest time that does not influence the immediately previous command process. This will be described with reference to FIG. 11. In order to normally complete a command CW for writing data "CD1" at an address "CA1" output from the CPU 10, a value input to the row decoder as the signal Row needs to be kept at "AA1" until "WC" is input to the command of the memory bus 25. Therefore, the next command needs to be input after a time that satisfies the condition, i.e., a "minimum write time" in FIG. 11 has elapsed.

The second write process in the drawing shows a case in which write target data WD2 (=CD2) and written data at a write address WA2 are matched with each other (when a comparison result Cmp2 in the comparing unit 37 represents matching). In this case, upon completion of the comparing process, since the read/write control unit 40 does not actually output an instruction to execute a write process in the memory cell, in FIG. 11, a command WC, an address WA2, and data WD2 are indicated by broken lines, and it is shown that the write process is not actually performed.

In the write process, since the instruction interpreting unit 31 gives the signal R/W representing a "High" state to the output control unit 33, the written data read by the read circuit 43 for a comparing process is not output to a data bus 21.

In the embodiment, in a write process in a memory cell, in order to sequentially process procedures, i.e., 1) a read process of the written data from the memory cell, 2) a comparing process between the written data and the write target data, and 3) a write process of the write target data in the memory, a time required for memory writing is longer than that in a conventional memory by a time for the read process and the comparing process. Therefore, the CPU 10 needs to output each command after a time longer than a maximum time (i.e., a time until the write process is completed when the comparison result represents mismatching) required for the write process to the memory cell has elapsed. This can be realized such that, for example, the CPU 10 itself extends an output interval of write commands.

A read operation in the embodiment will be described below with reference to the timing chart in FIG. 12.

When the CPU 10 transmits a CPU bus command (read) CR and a CPU bus address CA1 to the memory access control unit 20, the memory access control unit 20 converts the formats of the command and the address into formats suitable for the memory control unit 30 and transmits the command and the address to the memory control unit 30 through the memory bus 21. More specifically, the CPU bus address "CA1" is divided into an upper part "AA1 (row address)" and a lower part "RA1 (column address)", the "AA1" is output to the address of the memory bus 21 when an "AC (row address designation command)" is output to the command of the memory bus 21, and the "RA1" is output to the address of the memory bus 21 when a "RC (read command)" is output to the command of the memory bus 21. As a result, the "AC" and the "RC" output to the command of the memory bus 21 are given to the instruction interpreting unit 31, and the "AA1" and the "RA1" output to the address of the memory bus 21 are given to the buffer 32.

When the instruction interpreting unit 31 recognizes the input command as a row address designation command "AC", the instruction interpreting unit 31 transmits the command to the row address buffer 35 as the signal ComC. In synchronization with this, the row address "AA1" is transmitted from the buffer 32 to the row address buffer 35 as the signal AddC. For this reason, the row address buffer 35 transmits the row address "AA1" to the row decoder 53 as the signal Row by using a row address designation command "AC" as a trigger. The row decoder 53 activates the row address of the sub-bank 52A, which is designated by the signal Row.

When the instruction interpreting unit 31 recognizes the input command as the read command "RC", the instruction interpreting unit 31 transmits the command to the read/write control unit 40 as the signal ComC. In synchronization with this, since the column address "RA1" is transmitted from the buffer 32 to the read/write control unit 40 as the signal AddC, the read/write control unit 40 stores the "RA1" in the address buffer 44 therein by using the "RC" transmitted as the signal ComC as a trigger. Furthermore, the instruction interpreting unit 31 makes the R/W signal inactive (Low state) and gives the R/W signal to the output control unit 33 and the comparing unit 37.

The read/write control unit 40 outputs the read command RC and a read address to the column decoder 51A through the memory bus 25. As a read address value, the read address "RA1" given as the signal AddC from the buffer 32 and stored in the address buffer 44 is used. When the column decoder 51A receives the instruction, a predetermined voltage is applied to a bit line such that a read voltage is across both the terminals of a memory cell (selected memory cell) corresponding to the read address value RA1. When the row address "AA1" is given to a row decoder as the signal Row from the row address buffer 35, a predetermined voltage is applied to a word line and a source line, and a selected memory cell is activated. A current flowing in a voltage line connected to the selected memory cell is read by the read circuit 43 through the read/write control unit 40. In this manner, written data RD1 stored in the selected memory cell is read.

The read circuit 43 outputs the signal DE representing an output timing of the data RD1. Since the given signal R/W is in a Low state, the output control unit 33 outputs the written data RD1 transmitted from the read circuit 43 as the signal DatC to the memory access control unit 20 through the data bus 21 by using the signal DE as a trigger. The memory access control unit 20 gives the read data RD1 to the CPU 10 through the CPU bus 11. Since the signal R/W is in a Low state, the comparing unit 37 does not perform a comparing process using the written data RD1 transmitted from the read circuit 43 as the signal DatC.

The processes of the nonvolatile semiconductor memory device according to the embodiment are performed on the assumption that the processes are performed in units of bit widths (words). However, as in the configuration shown in FIG. 13, when a structure that transmits bit enable of data to the memory bus 25 is added, it can be determined by matching and mismatching between bits whether writing can be performed. In this case, it is assumed that the memory cell can perform a write process in units of bits. Writing in units of bits can be realized by applying a signal Comp of a comparison result of the comparing unit 37 to WEA [1:j] (j shows a bit width of a word) in FIG. 10.

Figure 11:
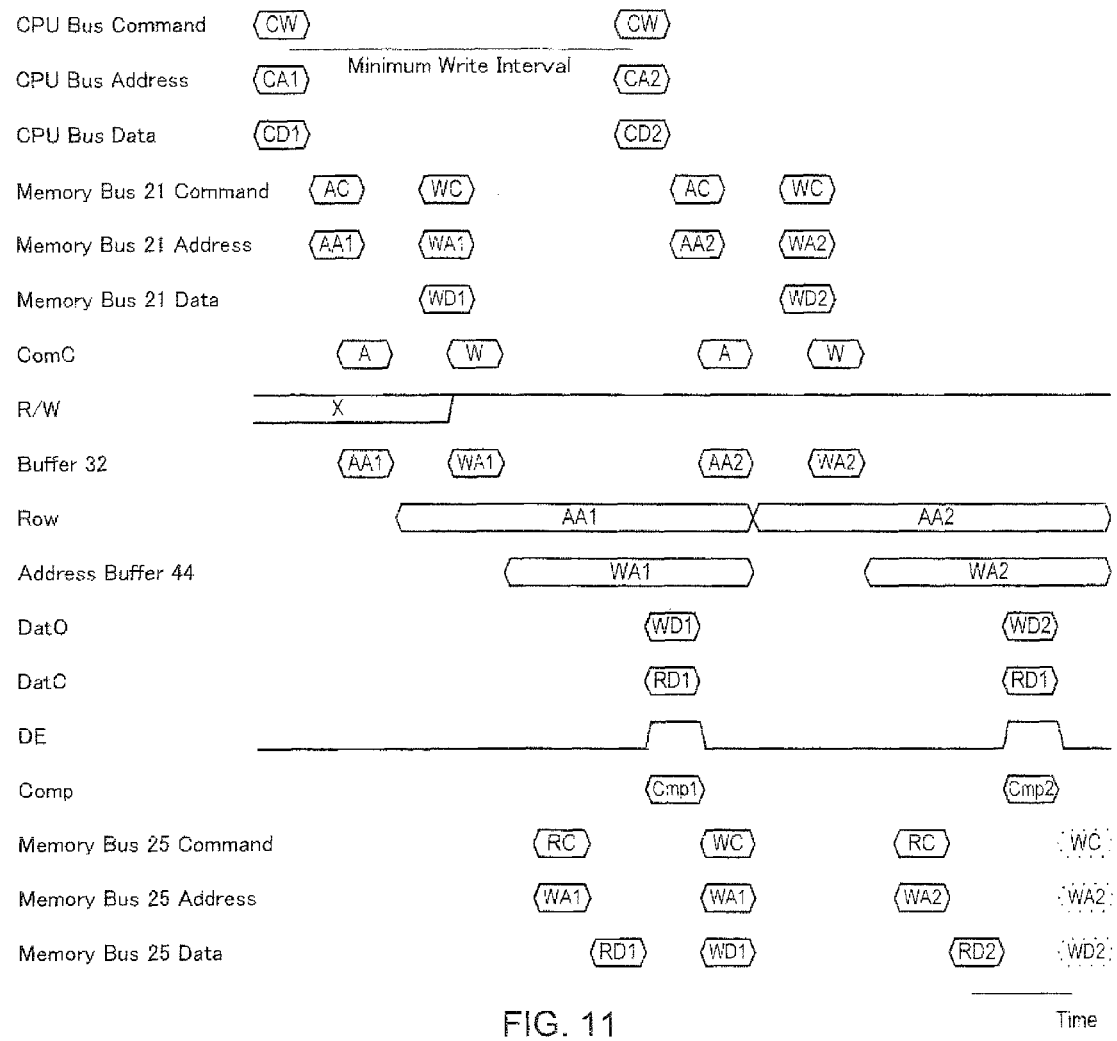
FIG. 11 is a timing chart obtained when writing is performed to the nonvolatile semiconductor memory device according to the third embodiment.
Figure 12:
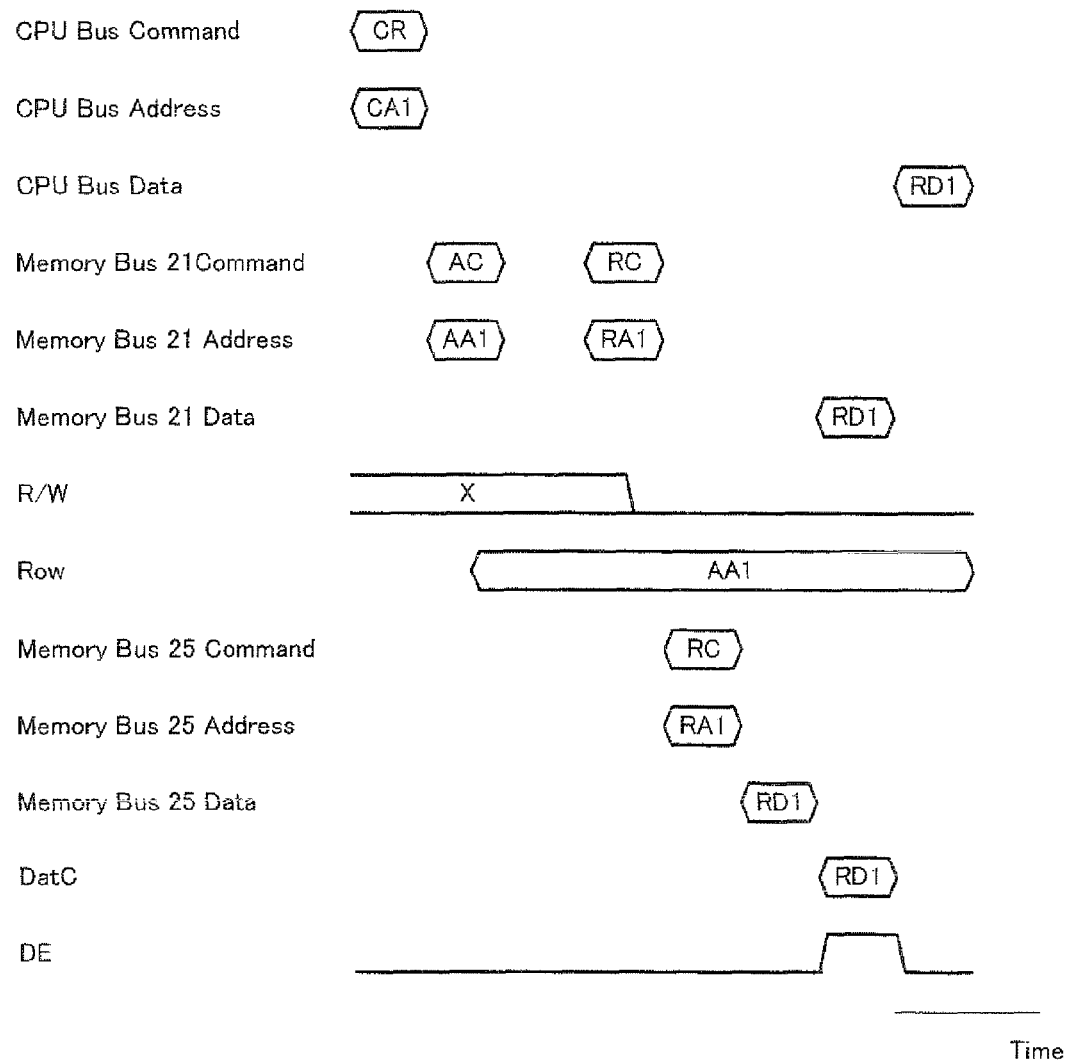
FIG. 12 is a timing chart obtained when reading is performed to the nonvolatile semiconductor memory device according to the third embodiment.
Figure 13:
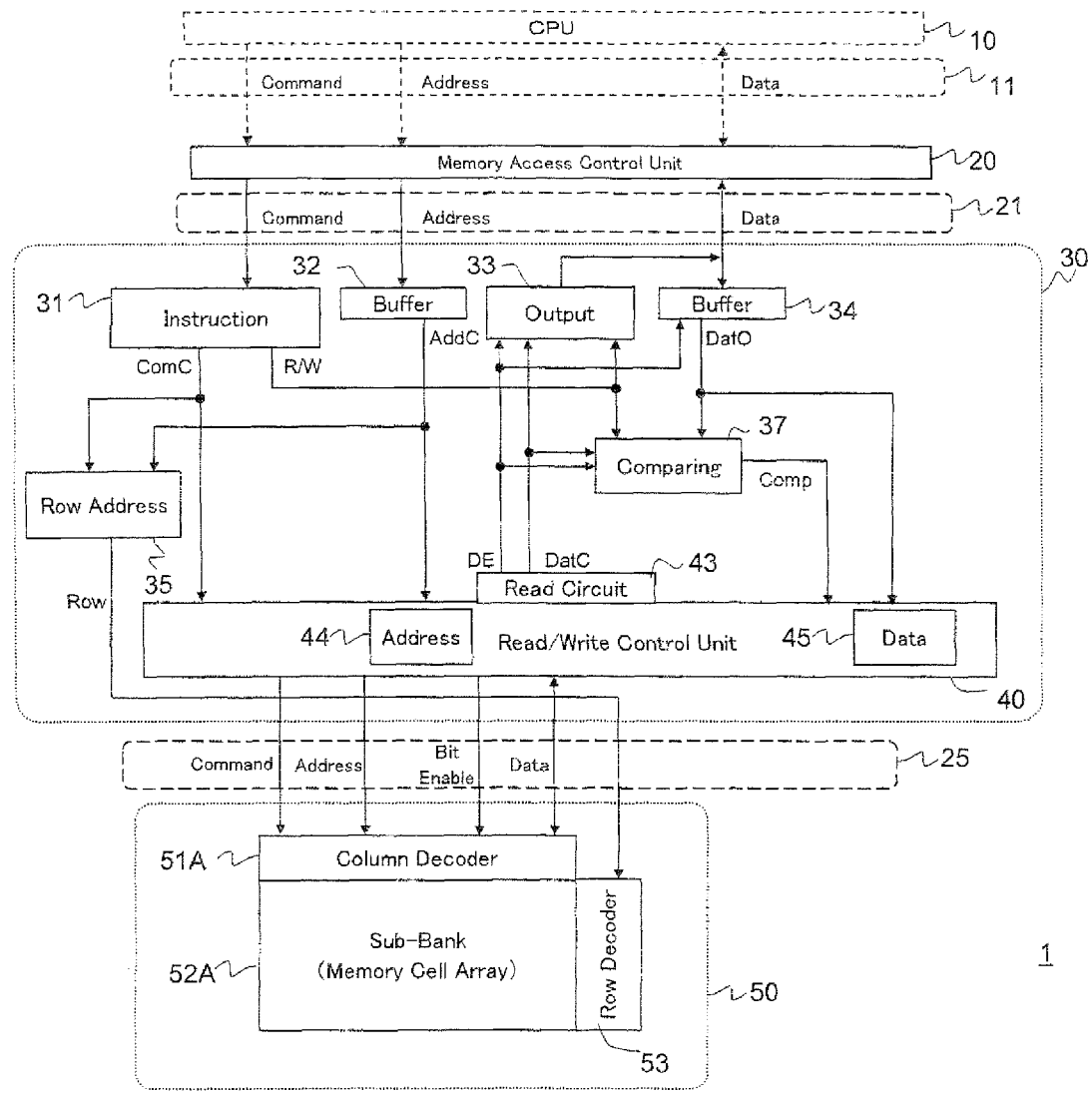
FIG. 13 is a block diagram showing another conceptual structure of a nonvolatile semiconductor memory device according to the third embodiment.

The timing charts shown in FIG. 11 and FIG. 12 show the principle of the embodiment. However, due to conditions of the bus and restrictions of the system or the like, processes such as replacement of clocks and conversion of an address value and a data bit width may be necessary. However, these processes may be arbitrarily selected and applied as needed, and a description thereof will be omitted because the description departs from the gist of the present invention.

In the embodiment, the processes realized by the memory control unit 30 can also be realized by software. More specifically, software (or firmware) executed on the CPU 10 performs a write process to a memory by the procedures shown in FIG. 14 to make it possible to realize processes equivalent to the processes realized by the memory control unit 30.

Figure 14:
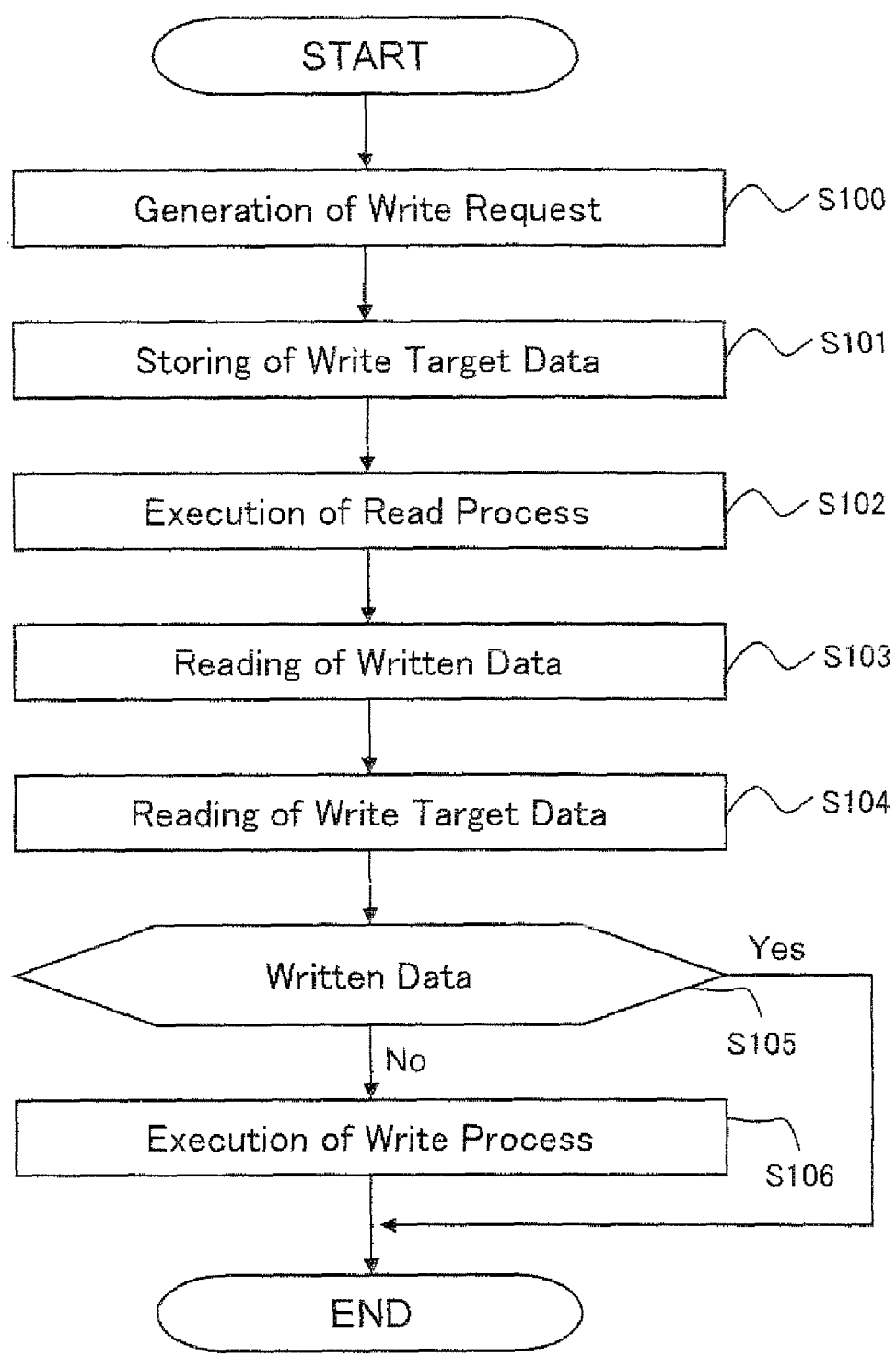
FIG. 14 is a flow chart showing a procedure performed when a write process of the nonvolatile semiconductor memory device according to the third embodiment is realized with software.

FIG. 14 is a flow chart showing a procedure performed when the processes in the embodiment are realized by software.

In the program executed in the CPU 10, when a write request to a memory cell is generated (step S100), write target data of the request is stored (step S101). As a destination in the write data is stored, a register or a cache (not shown) in the CPU 10 is desirable. However, when an external SRAM or DRAM is connected, the SRAM or DRAM may be used.

In a write request in step S100, in addition to the write target data, a write destination address is given.

The CPU 10 executes a read process of the written data at a write destination address designated by the write request in step S100 (step S102). When the read written data (data R) is received (step S103), the write target data (data W) stored in step S101 is read (step S104) to compare the write target data with the written data (step S105).

In the comparing process in step S105, when the written data and the write target data are matched with each other (Yes in step S105), a write process corresponding to the write request generated in step S100 is ended without performing any operation. On the other hand, when the comparison result represents mismatching (No in step S105), a process of writing the write target data at a write destination address is executed (step S106), and the write process corresponding to the write request generated in step S100 is ended.

When a read request to a memory cell is generated in the CPU 10, the process is performed by the same procedure as that of a read process in an existing CPU.

In each of the above embodiments, the explanation is made on the assumption that the memory cell is configured by an RRAM. However, the memory cell may be configured by a nonvolatile semiconductor element except for the RRAM.

EXPLANATION OF REFERENCES

1: Nonvolatile semiconductor memory device
10: CPU
11: CPU bus
20: Memory access control unit
21: Memory bus
25: Memory bus
30: Memory control unit
31: Instruction interpreting unit
32: Buffer
33: Output control unit
34: Buffer
35: Row address buffer
36: Read control unit
37: Comparing unit
38: Buffer
39: Write control unit
40: Write/read control unit
41: Read/write switching control unit
42: Sub-bank replacing unit
43: Read circuit
44: Address buffer
45: Data buffer
50: Memory
51A, 51B: Column decoder
51A0, 51A1, 51A2, 51A3, 51B0, 51B1, 51B2, 51B3: Column decoder
52A, 52B: Memory cell array (sub-bank)
52A0, 52A1, 52A2, 52A3, 52B0, 52B1, 52B2, 52B3: Sub-bank
53: Row decoder
60: Semiconductor substrate
61: Element isolation region
62: Gate insulating film
63: Gate electrode
64: Drain diffusion region
65: Source diffusion region
66: Insulating interlayer
67: Contact hole
68: Ohmic contact layer
69: Lower electrode
70: Variable resistor
71: Upper electrode
72: Insulating interlayer
73: Contact hole
74: Contact hole
75: Wiring layer
76: Wiring layer
77: Insulating interlayer
78: Wiring layer
79: Surface protecting film
100: Variable resistor
101: Upper electrode (first electrode)
102: Variable resistor
103: Lower electrode (second electrode)
501, 502, 503, 504: Memory unit
530, 531, 532, 533: Row decoder

The invention claimed is:

1. A nonvolatile semiconductor memory device comprising:
a memory cell array having a first sub-bank in which a plurality of nonvolatile memory cells are arranged in a form of a matrix, first terminals of the memory cells of the same row are connected to a common word line, and second terminals of the memory cells of the same column are connected to a common bit line and a second sub-bank having the same configuration as that of the first sub-bank;

a write/read control unit that performs write or read control for a target memory cell corresponding to a designated address;

a decoder unit that applies a voltage to the bit line and the word line based on an instruction from the write/read control unit to apply a write voltage or a read voltage to the target memory cell;

a read circuit that reads written data from the target memory cell to which the read voltage is applied; and a comparing unit that compares a plurality of data to be input, wherein, when respectively designated write target data are written in the plurality of target memory cells located in the first-sub-bank and the second sub-bank, the decoder unit executes, at the same time, a first operation in which a read voltage is applied to a first target memory cell in the first sub-bank, and a second operation in which a write voltage is applied to a second target memory cell only when a comparison result between the written data of the second target memory cell in the second sub-bank and the write target data to the second target memory cell by the comparing unit represents mismatching.

2. The nonvolatile semiconductor memory device according to claim 1, wherein, when the respectively designated write target data are written in the plurality of target memory cells located in the first sub-bank and the second sub-bank, the decoder unit is configured to execute an operation step including the first operation and the second operation two or more times while changing the first target memory cell and the second target memory cell, and the second target memory cell in each of the operation steps is the first target memory cell in the previously executed operation step.

3. The nonvolatile semiconductor memory device according to claim 1, wherein the decoder unit includes a row decoder that is arranged in common in the first sub-bank and the second sub-bank and simultaneously applies a voltage to the corresponding word lines in the first sub-bank and the second sub-bank, a first column decoder that applies a voltage to the bit line of the first sub-bank, a second column decoder that applies a voltage to the bit line of the second sub-bank, the first operation is an operation in which the first column decoder applies the read voltage to the bit line connected to the first target memory cell in a state in which the row decoder applies a voltage to the word line connected to the first target memory cell, and the second operation is an operation in which the second column decoder applies the write voltage to the bit line connected to the second target memory cell located at the same row as the first target memory cell only when a comparison result between the written data in the second target memory cell and the write target data to the second target memory cell represents mismatching.

4. The nonvolatile semiconductor memory device according to claim 1, wherein the memory cell array includes a plurality of memory units each configured by the first sub-bank and the second sub-bank, and the decoder unit is provided for each of the memory units, when the respectively designated write target data are written in the plurality of target memory cells arranged across the plurality of memory units, the decoder units provided in the memory units in which the target memory cells are present execute the first operation and the second operation in the same time zone.

5. The nonvolatile semiconductor memory device according to claim 1, wherein the memory cell comprises a variable resistive element a resistance of which is reversibly changed depending on an applied voltage and is configured to store information depending on the resistance of the variable resistive element.

6. A method of driving a nonvolatile semiconductor memory device including a memory cell array having a first sub-bank in which a plurality of nonvolatile memory cells are arranged in a form of a matrix, first terminals of the memory cells of the same row are connected to a common word line, and second terminals of the memory cells of the same column are connected to a common bit line, and a second sub-bank having the same configuration as that of the first sub-bank, wherein when respectively designated write target data are written in the plurality of target memory cells located in the first-sub-bank and the second sub-bank, a first operation in which a read voltage is applied to a first target memory cell in the first sub-bank, and a second operation in which a write voltage is applied to a second target memory cell only when a comparison result between written data of the second target memory cell in the second sub-bank and the write target data to the second target memory cell represents mismatching are executed at the same time.

7. The method of driving a nonvolatile semiconductor memory device according to claim 6, wherein an operation step including the first operation and the second operation is executed two or more times while changing the first target memory cell and the second target memory cell, and the second target memory cell in each of the operation steps is the first target memory cell in the previously executed operation step.

8. The method of driving a nonvolatile semiconductor memory device according to claim 6, wherein the memory cell array includes a plurality of memory units each configured by the first sub-bank and the second sub-bank, and, when the respectively designated write target data are written in the plurality of target memory cells arranged across the plurality of memory units, in each of the memory units in which the target memory cells are present, the first operation and the second operation are executed in the same time zone.

9. A nonvolatile semiconductor memory device comprising:

a memory cell array having a first sub-bank in which a plurality of memory cells are arranged in a form of a matrix, first terminals of the memory cells of the same row are connected to a common word line, and second terminals of the memory cells of the same column are connected to a common bit line and a second sub-bank having the same configuration as that of the first sub-bank;

a write/read control unit that performs write or read control for a target memory cell corresponding to a designated address;

a decoder unit that performs a write process or a read process in the target memory cell based on an instruction from the write/read control unit;

a read circuit that reads written data from the target memory cell; and a comparing unit that compares a plurality of data to be input, wherein, when respectively designated write target data are written in the plurality of target memory cells located in the first-sub-bank and the second sub-bank, the decoder unit executes, at the same time, a first operation in which a read process is performed in a first target memory cell in the first sub-bank and a second operation in which a write process is performed in a second target memory cell only when a comparison result between the written data of the second target memory cell in the second sub-bank and the write target data to the second target memory cell by the comparing unit represents mismatching.

10. The nonvolatile semiconductor memory device according to claim 2, wherein the decoder unit includes a row decoder that is arranged in common in the first sub-bank and the second sub-bank and simultaneously applies a voltage to the corresponding word lines in the first sub-bank and the second sub-bank, a first column decoder that applies a voltage to the bit line of the first sub-bank, a second column decoder that applies a voltage to the bit line of the second sub-bank, the first operation is an operation in which the first column decoder applies the read voltage to the bit line connected to the first target memory cell in a state in which the row decoder applies a voltage to the word line connected to the first target memory cell, and the second operation is an operation in which the second column decoder applies the write voltage to the bit line connected to the second target memory cell located at the same row as the first target memory cell only when a comparison result between the written data in the second target memory cell and the write target data to the second target memory cell represents mismatching.

11. The nonvolatile semiconductor memory device according to claim 2, wherein the memory cell array includes a plurality of memory units each configured by the first sub-bank and the second sub-bank, and the decoder unit is provided for each of the memory units, when the respectively designated write target data are written in the plurality of target memory cells arranged across the plurality of memory units, the decoder units provided in the memory units in which the target memory cells are present execute the first operation and the second operation in the same time zone.

12. The nonvolatile semiconductor memory device according to claim 2, wherein the memory cell comprises a variable resistive element a resistance of which is reversibly changed depending on an applied voltage and is configured to store information depending on the resistance of the variable resistive element.

13. The method of driving a nonvolatile semiconductor memory device according to claim 7, wherein the memory cell array includes a plurality of memory units each configured by the first sub-bank and the second sub-bank, and, when the respectively designated write target data are written in the plurality of target memory cells arranged across the plurality of memory units, in each of the memory units in which the target memory cells are present, the first operation and the second operation are executed in the same time zone.

* * * * *